United States Patent
Yang et al.

(10) Patent No.: US 10,700,710 B2
(45) Date of Patent: Jun. 30, 2020

(54) INDICATING A NUMBER OF COPIED INFORMATION BITS IN A RETRANSMISSION

(71) Applicant: QUALCOMM Incorporated, San Diego, CA (US)

(72) Inventors: Yang Yang, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/042,874

(22) Filed: Jul. 23, 2018

(65) Prior Publication Data

US 2019/0028119 A1 Jan. 24, 2019

Related U.S. Application Data

(60) Provisional application No. 62/536,358, filed on Jul. 24, 2017.

(51) Int. Cl.
*H03M 13/00* (2006.01)
*H03M 13/13* (2006.01)
(Continued)

(52) U.S. Cl.
CPC ....... *H03M 13/13* (2013.01); *H03M 13/6306* (2013.01); *H03M 13/6337* (2013.01);
(Continued)

(58) Field of Classification Search
CPC ............. H03M 13/13; H03M 13/6337; H03M 13/6343; H03M 13/6362; H04L 1/0057
See application file for complete search history.

(56) References Cited

U.S. PATENT DOCUMENTS

| | | | |
|---|---|---|---|
| 2018/0026751 A1* | 1/2018 | Li | H03M 13/13 714/751 |
| 2019/0115997 A1* | 4/2019 | Chen | H04L 1/00 |

FOREIGN PATENT DOCUMENTS

| | | |
|---|---|---|
| EP | 3113400 A1 | 1/2017 |
| WO | WO-2018126433 | 7/2018 |

OTHER PUBLICATIONS

Huawei, et al., "HARQ Scheme for Polar Codes," 3GPP Draft; R1-1613301 HARQ Scheme for Polar Codes, 3rd Generation Partnership Project (3GPP), Mobile Competence Centre; 650, Route Des Lucioles; F-06921 Sophia-Antipolis Cedex; France, vol. RAN WG1, No. Reno, USA; Nov. 14, 2016-Nov. 18, 2016, Nov. 19, 2016, XP051191170, 41 Pages, Retrieved from the Internet: URL: http://www.3gpp.org/ftp/tsg_ran/WG1_RL1/TSGR1_87/Docs/ [retrieved on Nov. 19, 2016].

(Continued)

*Primary Examiner* — Samir W Rizk
(74) *Attorney, Agent, or Firm* — Holland & Hart LLP

(57) ABSTRACT

Methods, systems, and devices are described for wireless communications. A transmitting device may generate first encoded bits by encoding first information bits using a polar code of a first size, N, and transmit the first encoded bits to a receiving device. After determining the receiving device failed to decode the encoded bits, the transmitting device may generate second encoded bits by encoding the first information bits using a polar code of a second size, 2N. In some cases, the transmitting device may use the first encoded bits and one or more copied information bits to generate the second encoded bits. The transmitting device may transmit the second encoded bits to the receiving device, along with an indication of the number of copied information bits used to generate the second encoded bits. The number of copied information bits may be based on changing channel conditions or transmission parameters.

30 Claims, 16 Drawing Sheets

(51) Int. Cl.
*H04L 1/00* (2006.01)
*H04L 1/18* (2006.01)

(52) U.S. Cl.
CPC ........ *H03M 13/6343* (2013.01); *H04L 1/001* (2013.01); *H04L 1/0041* (2013.01); *H04L 1/0045* (2013.01); *H04L 1/0057* (2013.01); *H04L 1/0068* (2013.01); *H04L 1/1819* (2013.01); *H04L 1/1867* (2013.01); *H04L 1/1896* (2013.01); *H03M 13/6362* (2013.01); *H04L 1/0075* (2013.01)

(56) References Cited

OTHER PUBLICATIONS

Huawei, et al., "IR-HARQ Scheme for Polar Codes," 3GPP Draft; R1-1700406 HARQ Scheme for Polar Codes, 3rd Generation Partnership Project (3GPP), Mobile Competence Centre; 650, Route Des Lucioles; F-06921 Sophia-Antipolis Cedex; France, vol. RAN WG1, No. Spokane, USA; Jan. 16, 2017-Jan. 20, 2017, Jan. 16, 2017, XP051207943, 4 pages, Retrieved from the Internet: URL: http://www.3gpp.org/ftp/Meetings_3GPP_SYNC/RAN1/Docs/ [retrieved on Jan. 16, 2017].

International Search Report and Written Opinion—PCT/US2018/043507—ISA/EPO—dated Oct.16, 2018.

Zhao M-M., et al., "An Adaptive IR-HARQ Scheme for Polar Codes by Polarizing Matrix Extension," IEEE Communications Letters, vol. 22 (7), Apr. 10, 2018, pp. 1306-1309, XP055513242, US ISSN: 1089-7798, DOI: 10.1109/LCOMM.2018.2825370, Section III.

Zte, et al., "HARQ Performance of Rate-Compatible Polar Codes," 3GPP Draft; R1-1613267 HARQ Performance OD Rate-Compatible Polar Codes, 3rd Generation Partnership Project (3GPP), Mobile Competence Centre; 650, Route Des Lucioles; F-06921 Sophia-Antipolis Cedex; vol. RAN WG1, No. Reno, US; Nov. 14, 2016-Nov. 18, 2016, Nov. 19, 2016, XP051191139, 8 pages, Retrieved from the Internet: URL: http://www.3gpp.org/ftp/tsg_ran/WG1_RL1/TSGR1_87/Docs/ [retrieved on Nov. 19, 2016].

\* cited by examiner

INDICATING A NUMBER OF COPIED INFORMATION BITS IN A RETRANSMISSION

CROSS REFERENCES

The present Application for Patent claims the benefit of U.S. Provisional Patent Application No. 62/536,358 by YANG, et al., entitled "INDICATING A NUMBER OF COPIED INFORMATION BITS IN A RETRANSMISSION," filed Jul. 24, 2017, which is assigned to the assignee hereof, and expressly incorporated by reference herein.

BACKGROUND

The following relates generally to wireless communication, and more specifically to indicating a number of copied information bits in a retransmission. Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system). A wireless multiple-access communications system may include a number of base stations, each simultaneously supporting communication for multiple communication devices, which may be otherwise known as user equipment (UE).

In some cases, wireless communications between a UE and base station may fail—e.g., due to degraded channel conditions, increased interference, etc. Techniques, such as coding schemes and hybrid automatic repeat request (HARQ) operation, may be used by wireless devices to increase the reliability of wireless communications. In some examples, a transmitting wireless device encodes information bits intended for another wireless device and transmits the encoded bits to the other wireless device. Polar encoding may increase the likelihood that the information bits are successfully received at the other wireless device since each encoded bit may provide additional information for decoding another encoded bit. Polar coding aside, a receiving wireless device may still fail to successfully decode received encoded bits, in which case the receiving wireless device may indicate to the transmitting device when a decoding fails. If HARQ operation is active, the transmitting device may then prepare a retransmission using polar coding and transmit the retransmission of the information bits to the receiving wireless device.

SUMMARY

Enhanced polar HARQ operation techniques for performing retransmissions of polar encoded data may be employed. For example, a transmitting device may generate first encoded bits by encoding first information bits using a polar code of a first size, N, and transmit the first encoded bits to a receiving device. After determining the receiving device failed to decode the encoded bits, the transmitting device may generate second encoded bits by encoding the first information bits using a polar code of a second size, 2N. In some cases, the transmitting device may use the first encoded bits and one or more copied information bits to generate the second encoded bits. The transmitting device may transmit the second encoded bits to the receiving device, along with an indication of the number of copied information bits used to generate the second encoded bits. The number of copied information bits may be based on changing channel conditions or transmission parameters.

A method of wireless communication is described. The method may include transmitting a first set of encoded bits to a device, the first set of encoded bits comprising a first codeword of a first size generated by mapping a plurality of information bits to a first set of polarized bit channels based on respective first bit channel reliabilities of the first set of polarized bit channels, receiving, from the device, an indication that a decoding of the first codeword was unsuccessful, communicating, with the device, an indication of a first number of copied information bits used for generating a second set of encoded bits, wherein a second codeword of a second size comprises the first set of encoded bits and the second set of encoded bits, and transmitting the second set of encoded bits to the device.

An apparatus for wireless communication is described. The apparatus may include means for transmitting a first set of encoded bits to a device, the first set of encoded bits comprising a first codeword of a first size generated by mapping a plurality of information bits to a first set of polarized bit channels based on respective first bit channel reliabilities of the first set of polarized bit channels, means for receiving, from the device, an indication that a decoding of the first codeword was unsuccessful, means for communicating, with the device, an indication of a first number of copied information bits used for generating a second set of encoded bits, wherein a second codeword of a second size comprises the first set of encoded bits and the second set of encoded bits, and means for transmitting the second set of encoded bits to the device.

Another apparatus for wireless communication is described. The apparatus may include a processor, memory in electronic communication with the processor, and instructions stored in the memory. The instructions may be operable to cause the processor to transmit a first set of encoded bits to a device, the first set of encoded bits comprising a first codeword of a first size generated by mapping a plurality of information bits to a first set of polarized bit channels based on respective first bit channel reliabilities of the first set of polarized bit channels, receive, from the device, an indication that a decoding of the first codeword was unsuccessful, communicate, with the device, an indication of a first number of copied information bits used for generating a second set of encoded bits, wherein a second codeword of a second size comprises the first set of encoded bits and the second set of encoded bits, and transmit the second set of encoded bits to the device.

A non-transitory computer readable medium for wireless communication is described. The non-transitory computer-readable medium may include instructions operable to cause a processor to transmit a first set of encoded bits to a device, the first set of encoded bits comprising a first codeword of a first size generated by mapping a plurality of information bits to a first set of polarized bit channels based on respective first bit channel reliabilities of the first set of polarized bit channels, receive, from the device, an indication that a decoding of the first codeword was unsuccessful, communicate, with the device, an indication of a first number of copied information bits used for generating a second set of encoded bits, wherein a second codeword of a second size comprises the first set of encoded bits and the second set of encoded bits, and transmit the second set of encoded bits to the device.

In some examples of the method, apparatus, and non-transitory computer-readable medium described above, the communicating comprises transmitting the indication of the first number of copied information bits.

Some examples of the method, apparatus, and non-transitory computer-readable medium described above may further include processes, features, means, or instructions for determining the first number of copied information bits based at least in part on second bit channel reliabilities of the first set of polarized bit channels and a second set of polarized bit channels corresponding to the second set of encoded bits.

Some examples of the method, apparatus, and non-transitory computer-readable medium described above may further include processes, features, means, or instructions for selecting a set of polarized bit channels of the second set of polarized bit channels for use by the first number of copied information bits based at least in part on a predetermined rule or set of rules.

Some examples of the method, apparatus, and non-transitory computer-readable medium described above may further include processes, features, means, or instructions for identifying a change in channel conditions for transmitting the second set of encoded bits relative to the transmitting the first set of encoded bits. Some examples of the method, apparatus, and non-transitory computer-readable medium described above may further include processes, features, means, or instructions for determining the respective second bit channel reliabilities of the first plurality of polarized bit channels and the second plurality of polarized bit channels based at least in part on the change in channel conditions. Some examples of the method, apparatus, and non-transitory computer-readable medium described above may further include processes, features, means, or instructions for selecting a set of polarized bit channels of the second set of polarized bit channels for use by the first number copied information bits based at least in part on the respective first bit channel reliabilities of the first set of polarized bit channels and the determined respective second bit channel reliabilities of the first plurality of polarized bit channels and the second plurality of polarized bit channels.

Some examples of the method, apparatus, and non-transitory computer-readable medium described above may further include processes, features, means, or instructions for transmitting an indication of the change in channel conditions.

Some examples of the method, apparatus, and non-transitory computer-readable medium described above may further include processes, features, means, or instructions for modifying a transmit parameter after transmitting the first set of encoded bits. Some examples of the method, apparatus, and non-transitory computer-readable medium described above may further include processes, features, means, or instructions for determining the respective second bit channel reliabilities of the first plurality of polarized bit channels and the second plurality of polarized bit channels based at least in part on the modified transmit parameter.

Some examples of the method, apparatus, and non-transitory computer-readable medium described above may further include processes, features, means, or instructions for modifying the transmit parameter comprises modifying a transmit power for the transmitting of the second set of encoded bits.

Some examples of the method, apparatus, and non-transitory computer-readable medium described above may further include processes, features, means, or instructions for transmitting an indication of the modified transmit parameter.

Some examples of the method, apparatus, and non-transitory computer-readable medium described above may further include processes, features, means, or instructions for receiving, from the device, an indication that a decoding of the second codeword was unsuccessful. Some examples of the method, apparatus, and non-transitory computer-readable medium described above may further include processes, features, means, or instructions for communicating, with the device, an indication of a second number of copied information bits used for generating a third set of encoded bits, wherein a third codeword of a third size comprises the first set of encoded bits, the second set of encoded bits, and the third set of encoded bits. Some examples of the method, apparatus, and non-transitory computer-readable medium described above may further include processes, features, means, or instructions for transmitting the third set of encoded bits to the device.

Some examples of the method, apparatus, and non-transitory computer-readable medium described above may further include processes, features, means, or instructions for determining the second number of copied information bits based at least in part on the respective second bit channel reliabilities of the first set of polarized bit channels and the second set of polarized bit channels and respective third bit channel reliabilities of the first plurality of polarized bit channels, the second plurality of polarized bit channels, and a third plurality of polarized bit channels corresponding to the third set of encoded bits.

In some examples of the method, apparatus, and non-transitory computer-readable medium described above, the communicating comprises communicating an indication of one or more polarized bit channels of the second set of polarized bits channels used by at least one of the plurality of information bits.

In some examples of the method, apparatus, and non-transitory computer-readable medium described above, the indication of the first number of copied information bits may be transmitted in a downlink control channel, and wherein the second set of encoded bits may be transmitted in a downlink data channel.

In some examples of the method, apparatus, and non-transitory computer-readable medium described above, the indication of the first number of copied information bits may be transmitted in a first portion of an uplink data channel, and wherein the second set of encoded bits may be transmitted in a second portion of the uplink data channel.

In some examples of the method, apparatus, and non-transitory computer-readable medium described above, the communicating comprises receiving the indication of the first number of copied information bits in a downlink control channel, and wherein the second set of encoded bits may be transmitted in an uplink data channel.

Some examples of the method, apparatus, and non-transitory computer-readable medium described above may further include processes, features, means, or instructions for determining, based on a transmission parameter and a channel estimate associated with transmitting the second set of encoded bits, a second number of copied information bits based at least in part on second bit channel reliabilities of the first set of polarized bit channels and a second set of polarized bit channels corresponding to the second set of encoded bits. Some examples of the method, apparatus, and non-transitory computer-readable medium described above may further include processes, features, means, or instructions for identifying that the second number of copied information bits may be different than the received first number of copied information bits.

Some examples of the method, apparatus, and non-transitory computer-readable medium described above may further include processes, features, means, or instructions for identifying a set of polarized bit channels of the second set of polarized bit channels corresponding to the first number of copied information bits based at least in part on a predetermined rule or set of rules.

Some examples of the method, apparatus, and non-transitory computer-readable medium described above may further include processes, features, means, or instructions for identifying a set of polarized bit channels of the second set of polarized bit channels based at least in part on iteratively modifying at least one of the transmission parameter or the channel estimate associated with the receiving of the second set of encoded bits until a number of polarized bit channels of the second set of polarized bit channels having the second respective bit channel reliabilities greater than the first respective bit channel reliabilities may be equal to the first number of copied information bits.

A method of wireless communication is described. The method may include receiving a first set of encoded bits from a device, the first set of encoded bits comprising a first codeword of a first size generated by mapping a plurality of information bits to a first set of polarized bit channels based on respective bit channel reliabilities of the first set of polarized bit channels, transmitting, to the device, an indication that decoding of the first codeword was unsuccessful, communicating, with the device, an indication of a first number of copied information bits used for generating a second set of encoded bits, wherein a second codeword of a second size comprises the second set of encoded bits and the first set of encoded bits, receiving the second set of encoded bits from the device, and performing a first decoding operation on the second codeword.

An apparatus for wireless communication is described. The apparatus may include means for receiving a first set of encoded bits from a device, the first set of encoded bits comprising a first codeword of a first size generated by mapping a plurality of information bits to a first set of polarized bit channels based on respective bit channel reliabilities of the first set of polarized bit channels, means for transmitting, to the device, an indication that decoding of the first codeword was unsuccessful, means for communicating, with the device, an indication of a first number of copied information bits used for generating a second set of encoded bits, wherein a second codeword of a second size comprises the second set of encoded bits and the first set of encoded bits, means for receiving the second set of encoded bits from the device, and means for performing a first decoding operation on the second codeword.

Another apparatus for wireless communication is described. The apparatus may include a processor, memory in electronic communication with the processor, and instructions stored in the memory. The instructions may be operable to cause the processor to receive a first set of encoded bits from a device, the first set of encoded bits comprising a first codeword of a first size generated by mapping a plurality of information bits to a first set of polarized bit channels based on respective bit channel reliabilities of the first set of polarized bit channels, transmit, to the device, an indication that decoding of the first codeword was unsuccessful, communicate, with the device, an indication of a first number of copied information bits used for generating a second set of encoded bits, wherein a second codeword of a second size comprises the second set of encoded bits and the first set of encoded bits, receive the second set of encoded bits from the device, and perform a first decoding operation on the second codeword.

A non-transitory computer readable medium for wireless communication is described. The non-transitory computer-readable medium may include instructions operable to cause a processor to receive a first set of encoded bits from a device, the first set of encoded bits comprising a first codeword of a first size generated by mapping a plurality of information bits to a first set of polarized bit channels based on respective bit channel reliabilities of the first set of polarized bit channels, transmit, to the device, an indication that decoding of the first codeword was unsuccessful, communicate, with the device, an indication of a first number of copied information bits used for generating a second set of encoded bits, wherein a second codeword of a second size comprises the second set of encoded bits and the first set of encoded bits, receive the second set of encoded bits from the device, and perform a first decoding operation on the second codeword.

Some examples of the method, apparatus, and non-transitory computer-readable medium described above may further include processes, features, means, or instructions for identifying a set of polarized bit channels of a second set of polarized bit channels corresponding to the first number of copied information bits based at least in part on second bit channel reliabilities of the first set of polarized bit channels and the second set of polarized bit channels corresponding to the second set of encoded bits.

In some examples of the method, apparatus, and non-transitory computer-readable medium described above, the identifying the set of polarized bit channels comprises determining, based on a transmission parameter and a channel estimate associated with the receiving of the first set of encoded bits, a number of the plurality of information bits for generating the second set of encoded bits that may be different than the first number.

Some examples of the method, apparatus, and non-transitory computer-readable medium described above may further include processes, features, means, or instructions for identifying one or more polarized bit channels corresponding to the first number of copied information bits based at least in part on a predetermined rule or set of rules, the one or more polarized bit channels being identified from a second set of polarized bit channels corresponding to the second set of encoded bits.

Some examples of the method, apparatus, and non-transitory computer-readable medium described above may further include processes, features, means, or instructions for identifying the set of polarized bit channels of the second set of polarized bit channels based at least in part on iteratively modifying at least one of the transmission parameter or the channel estimate associated with the receiving of the second set of encoded bits until a number of polarized bit channels of the second set of polarized bit channels having the second respective bit channel reliabilities greater than the first respective bit channel reliabilities may be equal to the first number of copied information bits.

In some examples of the method, apparatus, and non-transitory computer-readable medium described above, the identifying the set of polarized bit channels comprises: receiving an indication of a modified transmission parameter or a modified channel estimate for the receiving of the second set of encoded bits. Some examples of the method, apparatus, and non-transitory computer-readable medium described above may further include processes, features, means, or instructions for identifying the set of polarized bit channels based at least in part on the indication of the modified transmission parameter or the modified channel estimate.

Some examples of the method, apparatus, and non-transitory computer-readable medium described above may further include processes, features, means, or instructions for transmitting, to the device, an indication that decoding of the second codeword was unsuccessful. Some examples of the method, apparatus, and non-transitory computer-readable medium described above may further include processes, features, means, or instructions for communicating, with the device, an indication of a second number of copied information bits used for generating a third set of encoded bits, wherein a third codeword comprises the first set of encoded bits, the second set of encoded bits, and the third set of encoded bits. Some examples of the method, apparatus, and non-transitory computer-readable medium described above may further include processes, features, means, or instructions for receiving the third set of encoded bits from the device. Some examples of the method, apparatus, and non-transitory computer-readable medium described above may further include processes, features, means, or instructions for performing a second decoding operation on the third codeword.

In some examples of the method, apparatus, and non-transitory computer-readable medium described above, the communicating comprises communicating an indication of one or more polarized bit channels of the second set of polarized bits channels used by at least one of the plurality of information bits.

In some examples of the method, apparatus, and non-transitory computer-readable medium described above, the communicating comprises receiving the indication of the first number of copied information bits in a downlink control channel, and wherein the second set of encoded bits may be received in a downlink data channel.

In some examples of the method, apparatus, and non-transitory computer-readable medium described above, the communicating comprises transmitting the indication of the first number of copied information bits in a downlink control channel, and wherein the second set of encoded bits may be received in an uplink data channel.

In some examples of the method, apparatus, and non-transitory computer-readable medium described above, the communicating comprises receiving the indication of the first number of copied information bits in a first portion of an uplink data channel, and wherein the second set of encoded bits may be received in a second portion of the uplink data channel.

DETAILED DESCRIPTION

Figure 1:
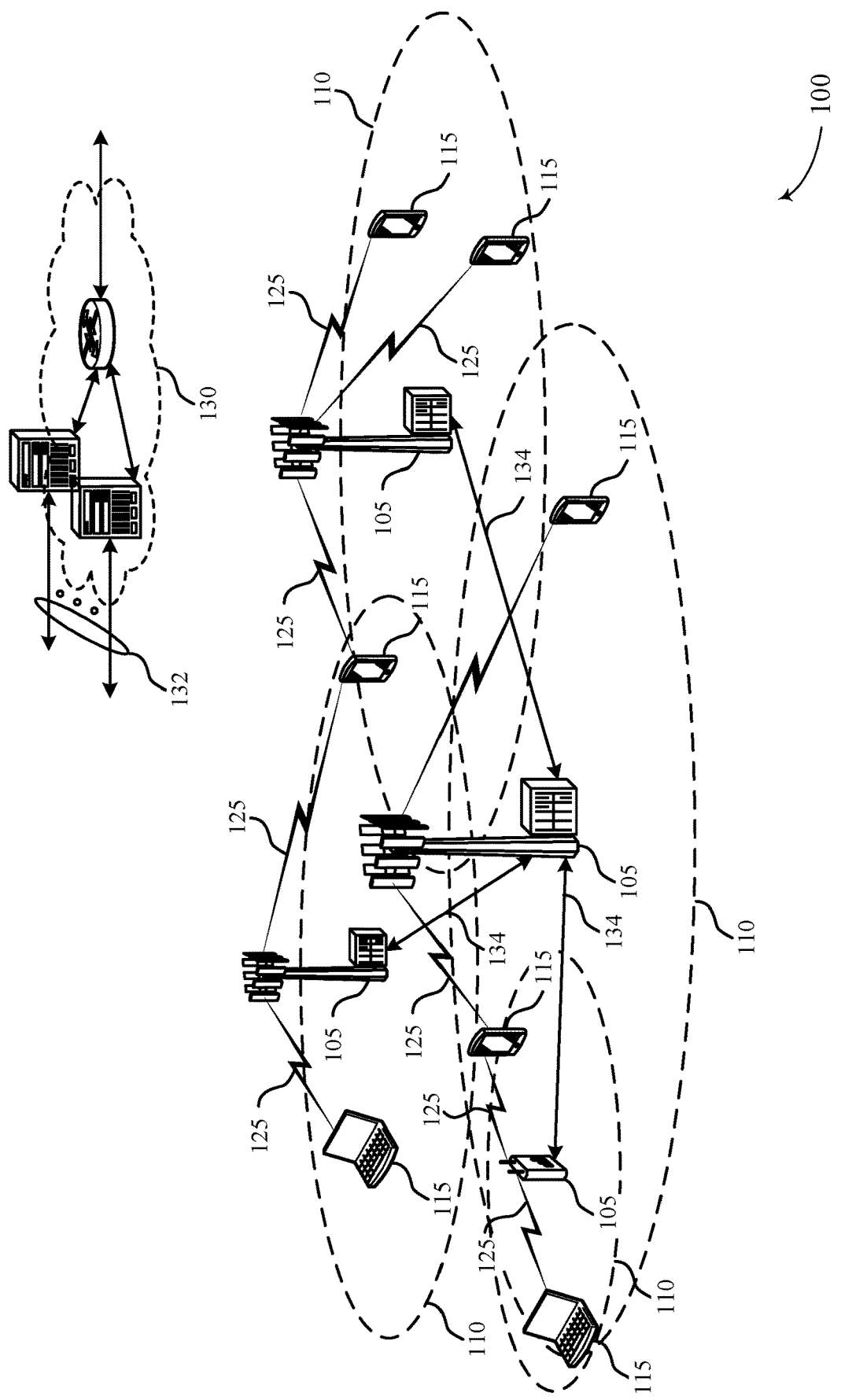
FIG. 1 illustrates an example of a wireless communications system that supports indicating a number of copied information bits in a retransmission in accordance with various aspects of the present disclosure.

Polar encoding may be used in combination with hybrid automatic repeat request (HARQ) operation (or "polar HARQ operation") to increase the reliability of data transmissions over a wireless transmission link. A polar HARQ operation may include encoding information bits using a polar code to generate a codeword of a first size for a transmission and transmitting some portion of a codeword generated from the information bits using a polar code of a second (e.g., larger) size for a retransmission. The likelihood of decoding information bits encoded with a larger polar code (e.g., size 2N) may be greater than the likelihood of decoding information encoded with a smaller polar code (e.g., size N). In some cases, wireless devices may employ enhanced polar HARQ operation techniques for performing retransmissions of polar encoded data.

In one example, a transmitting device encodes information bits for a receiving device using a first polar code of a first size (e.g., N), yielding a first set of encoded bits. To provide coding gain, the number of encoded bits is greater than the number of information bits. The first set of encoded bits may be understood as a first codeword. The transmitting device may transmit the first set of encoded bits to the receiving device. In some cases, the receiving device receives the first set of encoded bits but fails to successfully decode the first codeword. In such cases, the transmitting device may determine that the decoding was unsuccessful—e.g., based on receiving an indication from the receiving device or failing to receive any response from the receiving device—and prepare a retransmission to the receiving device.

When preparing the retransmission, the transmitting device may generate a second set of encoded bits using a second polar code of the first size (e.g., N) and the first set of encoded bits. In some cases, the transmitting device may assign known (or "frozen") bits to the polarized bit channels of the second polar code and may XOR the first set of encoded bits with the output of the second polar code. Where logic 0's are used as the frozen bits, the output of XOR'ing the first set of encoded bits with the output of the second polar code results in the same bit values as the first set of encoded bits. Thus, the bit values used for the second set of encoded bits may be the same as the first set of encoded bits. In some cases, the first and second sets of encoded bits together may be considered as making up a second codeword. Although the first and second encoded bits may be generated using polar codes of a first size, the second codeword including the first and second encoded bits may have an effective size of 2N.

After generating the second set of encoded bits, the transmitting device may transmit the second set of encoded bits to the receiving device. The receiving device may receive the second set of encoded bits and decode the second codeword using both the received first set of encoded bits and the received second set of encoded bits. As discussed above, the likelihood of decoding information bits encoded using a larger polar code may be higher than if the information bits were encoded using a smaller polar code. Thus, the receiving device may successfully decode the second codeword. In other cases, the receiving device may fail to decode the second codeword, in which case, the transmitting device may similarly generate third encoded bits and a third codeword may be understood as including the first set of encoded bits, the second set of encoded bits, and the third set of encoded bits, with an effective polar code size of 4N. More generally, the effective polar code size for a retransmission is $2^{(ceil(log_2(N_1+N_2+\ldots+N_n)))}$, where $N_1$ represents the number of encoded bits generated by the first polar code, $N_2$ represents the number of encoded bits generated by the second polar code, and so on. In some cases, the transmitting device XOR's the first set of encoded bits with the output of the third polar code and XOR's the second set of encoded bits with a second to last stage of the third polar code when generating the third encoded bits.

In some cases, the transmitting device may XOR a subset of the first set of encoded bits with a subset of second encoded bits at the output of the second polar code—e.g., when the transmitting device uses a subset of the second encoded bits. For example, the transmitting device may puncture one or more of the encoded bits for rate matching. In some cases, the first and second sets of encoded bits together may be considered as making up a second codeword. Although the first and second encoded bits may be generated using polar codes of a first size, the second codeword including the first encoded bits and a subset of the second encoded bits of may have an effective size of $2^{(ceil(log_2(N_1+N_2+\ldots+N_n)))}$ with $2^{(ceil(log_2(N_1+N_2+\ldots+N_n)))}-(N_1+N_2+N_3+\ldots N_n))$ coded bits punctured from the top.

In some examples, the transmitting device may copy one or more of the information bits to the polarized bit channels of the second polar code when generating the second set of encoded bits. For instance, the transmitting device may copy an information bit to a polarized bit channel of the second polar code if a reliability of the polarized bit channel is greater than a reliability of a polarized bit channel of the first polar code used by the information bit. As above, the transmitting device may transmit the second set of encoded bits to the receiving device. Similar to the transmitting device, the receiving device may identify which information bits have been copied and to which polarized bit channels of the second polar code the information bits have been copied based on determining if a reliability of one or more polarized bit channels of the second polar code is greater than a reliability of a polarized bit channel of the first polar code applied to the information bit. The receiving device may then use the second set of encoded bits along with the first set of encoded bits to decode the second codeword. In some cases, using copied information bits increases the likelihood that the receiving device will successfully decode the second codeword.

In some examples, the transmitting device and/or the receiving device may take into account changes in channel conditions and/or transmission parameters that occur between transmitting the first set of encoded bits and transmitting the second set of encoded bits when determining a number of information bits to copy to polarized bit channels of the second polar code. For example, if the transmitting device or the receiving device observes better channel conditions (e.g., an increase in SNR) for the second transmission, the transmitting device may copy additional information bits, or the receiving device may expect additional information bits to be copied, to the polarized bit channels of the second polar code. Or, if a transmitting device modifies transmission parameters to increase the likelihood of successful transmission (e.g., power boosting, using a lower throughput modulation scheme (e.g., using binary phase shift keying (BPSK) rather than quadrature phase shift keying (QPSK)), etc.), then the transmitting device may copy additional information bits to the polarized bit channels of the second polar code. The transmitting device may then transmit the second set of encoded bits to the receiving device, which may combine the second set of encoded bits with the first set of encoded bits to create the second codeword.

However, the receiving device may be unaware that the transmitting device has copied additional information bits to the corresponding polarized bit channels of the second polar code. For example, the receiving device may not observe the change in channel conditions observed by the transmitting device, or, the receiving device may not be aware that that the transmitting device has modified a transmission parameter. According to various aspects, the transmitting device may indicate to the receiving device how many information bits were copied to the polarized bit channels of the second polar code. In some cases, the transmitting device may transmit a copied information bit indicator to the receiving device in a downlink control channel. In other cases, the transmitting device may transmit a copied information bit indicator to the receiving device in an control portion of a uplink data channel that is encoded independently from a data portion of the uplink data channel.

Conversely, the transmitting device may be unaware that the receiving device is expecting additional copied information bits. For example, the transmitting device may not observe the change in channel conditions observed by the receiving device. Thus, the receiving device may request that the transmitting device copy a number of information bits to the polarized bit channels of the second polar code. In some cases, the transmitting device may transmit a copied information bit indicator to the receiving device in a control or data channel. In other cases, the receiving device may transmit a copied information bit request to the transmitting device in a control or data channel.

The transmitting and/or receiving device may compare the received indication of, or request for, the number of copied information bits with a number of copied information bits determined at the respective transmitting or receiving device. If the numbers are the same, the transmitting or receiving device may determine that expected information bits are copied to expected polarized bit channels of the second polar code. If the numbers are not the same, the transmitting or receiving device may determine that one or more information bits are copied to unexpected polarized bit channels.

If the transmitting or receive device determines that one or more information bits are copied to unexpected polarized bit channels, the transmitting or receiving device may identify which information bits are copied to which polarized bit channels of the second polar code. In some cases, the transmitting and receiving device use a shared, agreed-upon set of rules for copying information bits to polarized bit channels of the second polar code to identify which information bits are copied to which polarized bit channels of the second polar code. For instance, the predetermined rule may state that the information bit mapped to the lowest reliability (e.g., given by the bit channel reliabilities of the second polar code) polarized bit channel of the first polar code is to be copied to the highest reliability polarized bit channel of the second polar code, the information bit mapped to the second lowest reliability polarized bit channel of the first polar code is to be copied to the second highest reliability polarized bit channel of the second polar code, and so on.

In some cases, the receiving device uses an iterative approach to identify which information bits are copied to which polarized bit channels of the second polar code. For instance, the receiving device may assume incremental changes in a channel condition or transmission parameter until the receiving device determines that the estimated number of copied information bits matches the indicated number of copied information bits to be included in the polarized bit channels of the second polar code.

In some cases, the receiving device uses an explicit or additional indication received from the transmitting device to identify which information bits are copied to which polarized bit channels of the second polar code. For instance, the receiving device may receive an indication from the base station of which information bits are copied to which polarized bit channels of the second polar code. In another instance, the receiving device may receive an indication from the base station of an observed change in channel conditions or a modification to a transmission parameter, and may determine which information bits are copied to which polarized bit channels of the second polar code based on calculating bit channel reliabilities for the polarized bit channels of the second polar code, taking into account the change in channel conditions or transmission parameters.

If the transmitting device receives a request for a number of copied information bits, the transmitting device may use the above techniques to copy the information bits to the polarized bit channels of the second polar code based on the identified copied information bit locations. Or if the receiving device receives an indication of the number of copied information bits, the receiving device may use the above techniques to decode the received second codeword based on the corresponding identified copied information bit locations.

Features of the disclosure introduced above are further described below in the context of a wireless communication system. Specific examples are then described of example encoding schemes, resource allocations, indicators, and process flows for indicating a number of copied information bits in a retransmission. These and other features of the disclosure are further illustrated by and described with reference to apparatus diagrams, system diagrams, and flowcharts that relate to indicating a number of copied information bits in a retransmission.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A) network, or a New Radio (NR) network. In some cases, wireless communications system 100 may support enhanced broadband communications, ultra-reliable (e.g., mission critical) communications, low latency communications, and communications with low-cost and low-complexity devices.

Base stations 105 may wirelessly communicate with UEs 115 via one or more base station antennas. In some cases, the transmissions may be encoded using a polar code design. Each base station 105 may provide communication coverage for a respective geographic coverage area 110. Communication links 125 shown in wireless communications system 100 may include uplink transmissions from a UE 115 to a base station 105, or downlink transmissions from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105 or next generation NodeBs (gNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, Internet Protocol (IP) connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra-high frequency (UHF) frequency region using frequency bands from 700 MHz to 2600 MHz (2.6 GHz), although some networks (e.g., a wireless local area network (WLAN)) may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 105) to shape and/or steer an overall antenna beam in the direction of a target receiver (e.g., a UE 115). Such steering may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station 105) and a receiver (e.g., a UE 115), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use HARQ to provide retransmission at the MAC layer to improve link efficiency. In the control plane, the Radio Resource Control (RRC) protocol layer may provide establishment, configuration, and maintenance of an RRC connection between a UE 115 and a network device such as a base station 105, or core network 130 supporting radio bearers for user plane data. At the Physical (PHY) layer, transport channels may be mapped to physical channels.

A shared radio frequency spectrum band may be utilized in an NR shared spectrum system. For example, an NR shared spectrum may utilize any combination of licensed, shared, and unlicensed spectrums, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

Base stations 105 and UEs 115 may use a polar coding to increase the reliability of a communications link. A polar code may an example of a linear block error correcting code and has been shown to asymptotically approach the theoretical channel capacity as the code length increases. Polar codes are based on polarization of sub-channels used for information bits or known "frozen" bits (e.g., predetermined bits set to a '0' or a '1'), with information bits generally assigned to the higher reliability sub-channels. A base station 105 and a UE 115 may use a polar code design to encode information bits of an input vector to obtain a codeword for transmission.

Base stations 105 and UEs 115 may also use HARQ operations to increase the reliability of a communications link. HARQ operation may include retransmitting previously transmitted codewords one or more times, allowing a receiving device to perform successive decoding operations. Each decoding operation may provide the receiving device with additional information for decoding and increase the likelihood of a successful decoding of the codeword. In some cases, retransmissions benefit from improved channel conditions or enhanced transmit parameters relative to the first transmission, further increasing the likelihood of a successful decoding of the codeword.

In some examples, base stations 105 and UEs 115 may use polar coding in combination with HARQ operation to further increase the reliability of a communications link. As discussed above, polar codes approach the theoretical channel capacity as the code length increase, and each retransmission for a HARQ operation may effectively increase the code length of a data transmission. That is, a first transmission may be associated with a polar code of a first size N and a first codeword, a first retransmission may be associated with a polar code of a second size 2N and a second codeword, a second retransmission may be associated with a polar code of a third size (e.g., 4N) and a third codeword, and so on. Thus, the likelihood of decoding each successive codeword may increase.

As also mentioned above, each sub-channel, or polarized bit channel, of a polar code may be associated with a reliability, and the reliability of some sub-channels may be higher than others. In the context of HARQ operation, first sub-channels of an effective polar code used to generate the first codeword may have first reliabilities and second sub-channels of the effective polar code used to generate the second codeword may have second reliabilities. In some cases, the first and second reliabilities are based on channel conditions and/or transmission parameters. Thus, the reliabilities of the second sub-channels may be improved relative to the first reliabilities of the first sub-channels if channel conditions improve or if enhanced transmission parameters are used for the first retransmission. In some cases, a transmitting device may copy one or more information bits used to generate the first codeword to the second sub-channels to benefit from an increased reliability relative to the first sub-channels.

As discussed above, a reliability of the second sub-channels may be based on changed conditions, such as channel conditions or modified transmission parameters. In some examples, the changed conditions are observed or known to only one of a transmitting or receiving device that are communicating with one another. Thus, a transmitting device may copy more or less information bits to the second sub-channels than a receiving device expects or a receiving device may expect that the transmitting device copied more or less information bits to the second sub-channels than the transmitting device actually did. In some cases, a transmitting device may indicate to the receiving device a number of copied information bits used for generating a retransmission. In some cases, a receiving device may request that a transmitting device copy a number of information bits for generating a retransmission. By indicating or requesting number of copied information bits for generating a retransmission, a transmitting and receiving device may flexibly determine a number of bits to copy for a retransmission based on changing conditions that may be known to only one of the transmitting or receiving device.

Figure 2:
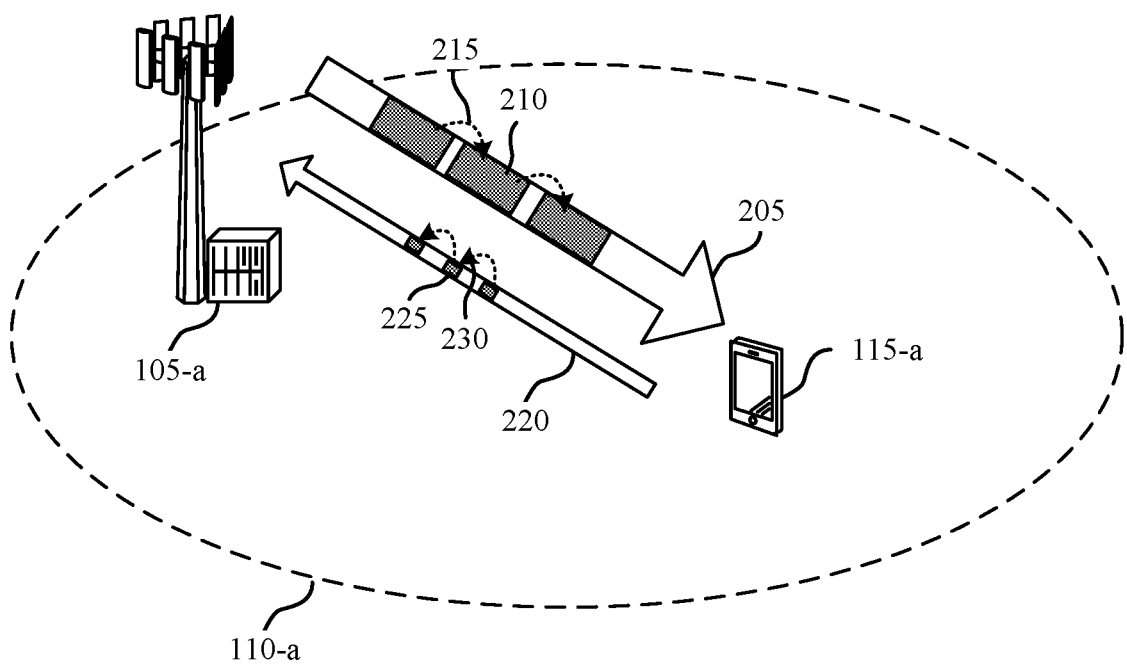
FIG. 2 illustrates an example of a wireless communications subsystem that supports indicating a number of copied information bits in a retransmission in accordance with various aspects of the present disclosure.

FIG. 2 illustrates an example of a wireless communications subsystem 200 that supports indicating a number of copied information bits in a retransmission in accordance with various aspects of the present disclosure. Wireless communications subsystem 200 may include UE 115-a, base station 105-a, and coverage area 110-a, which may be examples of a UE 115, a base station 105, and coverage area 110, as described above with reference to FIG. 1. UE 115-a and base station 105-a may communicate with one another within coverage area 110-a as described above with reference to FIG. 1.

Downlink 205 may be used for transmitting control information and data to device(s) within coverage area 110-a, such as UE 115-a. In some cases, downlink 205 uses time and frequency resources in dedicated or shared wireless spectrum. Uplink 220 may be used for transmitting control information and data to device(s) within coverage area 110-a, such as base station 105-a. In some cases, uplink 220 uses time and frequency resources in dedicated or shared wireless spectrum.

UE 115-a and base station 105-a may communicate with one another over downlink 205 and uplink 220. In some cases, downlink 205 and uplink 220 may be supported via carriers operating in a frequency division duplexing (FDD) mode (e.g., employing non-overlapping frequency resources). In some examples, a different frequency bandwidth is allocated to uplink 220 than to downlink 205. In some cases, downlink 205 and uplink 220 may be supported via a carrier operating in a time division duplexing (TDD) mode (e.g., employing overlapping frequency resources and non-overlapping time resources).

In some examples, base station 105-a may transmit over downlink 205. Base station 105-a and UE 115-a use HARQ operations to increase the reliability of communications. For instance, base station 105-a may transmit original transmissions and retransmissions over downlink 205. In some examples, base station 105-a uses polar coding to transmit information to UE 115-a. Polar coding may increase the likelihood of reception of the transmitted information at the UE 115-a. In some cases, base station 105-a polar encodes a data vector (e.g., a code block) for transmission to UE 115-a in a first transmission. In some examples, base station 105-a uses a polar code of a first size (e.g., size N) to encode the data vector. A polar code of size N may include a corresponding number of polarized bit channels—e.g., a size 8 polar code may include 8 polarized bit channels. Base station 105-a may assign the information bits to a subset of the available polarized bit channels and set the remaining polarized bit channels to a known value (e.g., "frozen" bits); thus, the polar encoding may result in more encoded bits than information bits. In some cases, base station 105-a assigns the information bits to the available polarized bit channels based on respective reliabilities of the polarized bit channels—e.g., base station 105-a may assign the information bits to the highest reliability polarized bit channels.

Base station 105-a may transmit the encoded bits or a subset of the encoded bits (using rate matching) to UE 115-a in what may be referred to as a first transmission or an original transmission after encoding the data vector. UE 115-a may receive the first transmission and decode the encoded bits according to polar coding techniques using a polar code of the first size (e.g., N). In some cases, UE 115-a may fail to decode the first transmission—e.g., due to poor channel conditions that corrupt the codeword sent in the first transmission, in which case, UE 115-a may indicate to base station 105-a that the first transmission was unsuccessfully received—e.g., by sending a negative acknowledgment (NAK) over uplink 220 or by failing to respond with either a NAK or an acknowledgement (ACK). In some examples, UE 15-a may indicate the NAK or ACK in uplink indicator 230.

Base station 105-a may prepare a retransmission 210 of the data to UE 115-a based on determining that the first transmission was unsuccessfully received. As above, base station 105-a may use polar encoding to send the data to UE 115-a. In some examples, base station 105-a prepares the retransmission 210 by assigning frozen bits (e.g., either 1's or 0's) to the input of polarized bit channels of a second polar code (e.g., of size N) and XOR'ing the encoded bits used in the first transmission with the encoded frozen bits, yielding second encoded bits. Where logic 0's are used as the frozen bits, the XOR'ing operation may result in the second encoded bits being the same as the first encoded bits.

In some examples, base station 105-a may copy one or more of the information bits to polarized bit channels of the second polar code. In some cases, base station 105-a may select a number of information bits for copying based on bit channel reliabilities of a polar code of a third size (e.g., size 2N), where the polar code of the third size is constructed by combining the first polar code with the second polar code. In some cases, the polar code of the third size may be associated with different polarized bit channel reliabilities than the polarized bit channels of the polar code of the first size and the polar code of the second size, as will be discussed in more detail in FIG. 3. In some examples, the bit channel reliabilities of the polar code of the third size are based on a change in channel conditions—e.g., are increased when a signal-to-noise ratio (SNR) or signal-to-interference-plus-interference ratio (SINR) is higher—a change in a transmit power—e.g., are increased when a transmit power is increased, or an indicator received from UE 115-a indicating a number of information bits for base station 105-a to copy for a retransmission. Base station 105-a may also select polarized bit channels for copying the one or more information bits based on bit channel reliabilities of the polar code of the third size, as will be discussed in more detail in FIG. 3. Base station 105-a may transmit the second encoded bits to UE 115-a in a retransmission 210 after preparing the retransmission of the data, with or without copying information bits for the retransmission. In some cases, base station 105-a may transmit the retransmission 210 in a downlink data channel.

Base station 105-a and UE 115-a may communicate the number of copied information bits used for or requested to be used for a retransmission using downlink indicator 215 or uplink indicator 230. Base station 105-a and UE 115-a may also communicate a number of copied information bits (e.g., from none to all of the information bits) in a retransmission 210, polarized bit channel locations for the copied information bits, a change in channel conditions, or a modification to a transmit power, or any combination thereof, to UE 115-a in a downlink indicator 215. For instance, base station 105-a may transmit an indication of the number of copied information bits in a corresponding retransmission 210 in downlink indicator 215. In some cases, base station 105-a may transmit the downlink indicator 215 in a downlink control channel. In another instance, UE 115-a may request that a number of information bits be copied in a corresponding retransmission 210 in uplink indicator 230.

UE 115-a may receive the retransmission 210 and the downlink indicator 215 over downlink 205, and may decode the first and second encoded bits according to polar decoding techniques using a polar code of the third size. In some cases, UE 115-a may decode the retransmission 210 based on the information provided in the downlink indicator 215. For instance, UE 115-a may decode the first and second encoded bits based on determining that copied information bits were used for generating the retransmission 210. In some examples, UE 115-a may successfully decode the retransmission 210 and transmit an ACK to base station 105-a, in which case, base station 105-a may move on to transmitting new data. In other examples, UE 115-a may unsuccessfully decode the retransmission 210 and indicate to base station 105-a that the retransmission was unsuccessfully received, in which case base station 105-a may prepare a second retransmission using similar techniques as described above—e.g., by determining a number of information bits to copy for the second retransmission and indicating the number of copied information bits to UE 115-a.

In some examples, UE 115-a may transmit control information or data to base station 105-a over uplink 220. Similar to base station 105-a, UE 115-a may polar encode information bits using a polar code of a first size prior to transmitting to base station 105-a in a first or original transmission. And base station 105-a may indicate to UE 115-a whether the transmission was successfully received. In some cases, base station 105-a may also indicate to UE 115-a a number of information bits to copy for a retransmission in downlink indicator 215.

If the transmission was not successfully received, UE 115-a may prepare a retransmission 225 to base station 105-*a*. In some cases, UE 115-*a* may copy one or more of the information bits to polarized bit channels of a polar code of a second size and may indicate the number of copied information bits to base station 105-*a*. In some examples, UE 115-*a* may select the number of information bits to copy based on channel conditions, transmit parameters, an indicator received from base station 105-*a* indicating a number of information bits for UE 115-*a* to copy for a retransmission, or any combination thereof. For instance, base station 105-*a* may request that a number of information bits be copied in a corresponding retransmission 225 in downlink indicator 215. UE 115-*a* may transmit the retransmission 225 to base station 105-*a* after selecting the number of information bits to copy.

UE 115-*a* may also indicate the selected number of information bits copied to polarized bit channels of the second polar code for the retransmission 225 to base station 105-*a* in uplink indicator 230. Uplink indicator 230 may also be used to indicate a change in channel conditions, a change in transmit parameters, an ACK or NAK, or any combination thereof. In some examples, UE 115-*a* may transmit the uplink indicator 230 in a control portion of an uplink data channel and the data retransmission in a data portion of the uplink data channel. In some cases, UE 115-*a* may encode the indicator separately from the retransmission so that base station 105-*a* may decode the indicator independently from the data.

Figure 3:
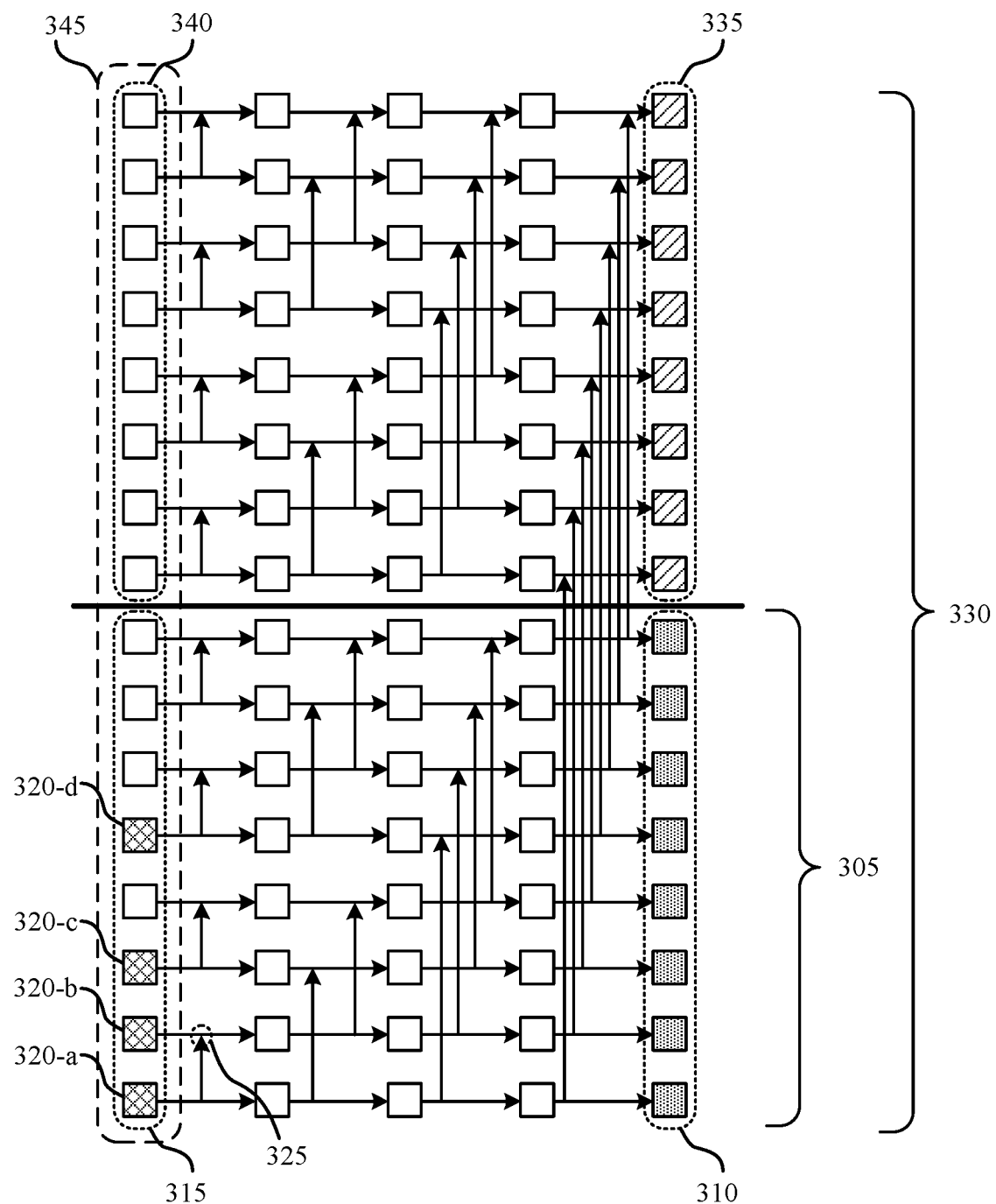
FIGS. 3-6 illustrate example encoding schemes that support indicating a number of copied information bits in a retransmission in accordance with various aspects of the present disclosure.

FIG. 3 illustrates an example of an encoding scheme 300 that supports indicating a number of copied information bits in a retransmission in accordance with various aspects of the present disclosure. Encoding scheme 300 may illustrate aspects of a transmission between a UE 115 and a base station 105, as described above with reference to FIGS. 1-2. Encoding scheme 300 may include first codeword 305 and second codeword 330. First codeword 305 may be composed of first encoded bits 310, which may be generated using first polarized bit channels 315, information bits 320-*a* to 320-*d*, and XOR operations 325. Second codeword 330 may be composed of first encoded bits 310 and second encoded bits 335, which may be generated using second polarized bit channels 340, XOR operations 325, and first encoded bits 310.

A transmitting device, such as a base station or UE, may identify data intended for a receiving device, such as a base station or UE. In some cases, all or a portion of the identified data is represented as information bits 320-*a* to 320-*d*. The transmitting device may map information bits 320-*a* to 320-*d* to polarized bit channels 315, which may be associated with a polar code of a first size (e.g., size 8). In some examples, the transmitting device maps information bits 320-*a* to 320-*d* to the highest reliability channels of polarized bit channels 315. After mapping information bits 320-*a* to 320-*d* to the highest reliability polarized bit channels, the transmitting device may polar encode information bits 320-*a* to 320-*d* by XOR'ing the polarized bit channels 315 with one another at different stages of the encoding process. The polar encoding of information bits 320-*a* to 320-*b* may yield first encoded bits 310, which may compose first codeword 305.

The transmitting device may transmit first encoded bits 310, or first codeword 305, to the receiving device, which may receive and attempt to decode first encoded bits 310. If the receiving device properly decodes first encoded bits 310—e.g., a cyclic redundancy check (CRC) of a candidate decoding path of first encoded bits 310 passes—then the receiving device may transmit an ACK to the transmitting device and the transmitting device may transmit new data, or information bits, in a subsequent transmission. If the receiving device fails to properly decode first encoded bits 310, then the receiving device may indicate the failure by transmitting a NAK or by not transmitting any acknowledgment response to the transmitting device.

In some examples, the transmitting device may determine that the receiving device has failed to properly decode first encoded bits 310—by receiving a NAK or no response—and prepare a retransmission to the receiving device. The transmitting device may prepare the retransmission by assigning frozen bits (e.g., either all logic 0's or all logic 1's) to second polarized bit channels 340, which may be associated with a polar code of a second size (e.g., size 8). Like first polarized bit channels 315, values of the second polarized bit channels 340 may be polar encoded by XOR'ing the second polarized bit channels 340 with one another, yielding second encoded bits 335. But by using frozen bits that are all logic 0's, the result of the polar encoding may be the same or flipped from the earlier polar encoding that yielded first encoded bits 310—e.g., since an XOR gate with a fixed logic 0 input and a variable logic input always outputs the same value provided to the variable logic input. In some cases, the reliabilities of second polarized bit channels 340 are higher or lower than the reliabilities of polarized bit channels 315—e.g., based on changing channel conditions or transmit parameters.

Although the second encoding process uses second polarized bit channels 340, the second encoding process may be understood as using combined polarized bit channels 345, which includes first polarized bit channels 315 and second polarized bit channels 340, and the corresponding polar code may have an effective size (e.g., size 16) that is equal to the sum of the first polar code (e.g., size 8) and the second polar code (e.g., size 8). Polarized bit channels of the larger polar code may be associated with different reliabilities than the reliabilities observed when looking at the first polar code and second polar code separately. That is, the reliabilities of first polarized bit channels 315 may be ranked from top to bottom as {8, 6, 7, 4, 5, 3, 2, 1}, where 1 is the highest reliability, and the reliabilities of second polarized bit channels 340 may also be ranked from top to bottom as {8, 6, 7, 4, 5, 3, 2, 1}, where 1 is the highest reliability. But for combined polarized bit channels 345 the reliabilities of first polarized bit channels 315 and second polarized bit channels 340 may be ranked together. For example, the reliabilities of combined polarized bit channels 345 may be ranked from top to bottom as {16, 15, 13, 14, 12, 10, 4, 3, 9, 11, 8, 6, 7, 5, 2, 1}, where 1 is the highest reliability. The bit channel reliabilities of combined polarized bit channels 345 may be based on conditions associated with transmitting second encoded bits 335—e.g., a change in channel conditions or a change in transmit power. For instance, when channel conditions improve after transmitting first encoded bits, the reliabilities of the top polarized bit channels (e.g., polarized bit channels 340) in combined polarized bit channels 345 may be ranked higher than when the same channel conditions are present for the second transmission as for the first transmission, for example, the reliabilities of polarized bit channels 345 may be ranked from top to bottom as {12, 10, 9, 7, 6, 4, 3, 2, 16, 15, 14, 13, 11, 8, 5, 1}.

The transmitting device may transmit second encoded bits 335 to the receiving device, which may combine the received first encoded bits 310 with the received second encoded bits 335 to form second codeword 330. In some examples, a transmitting device may copy one or more of information bits 320-*a* to 320-*d* to one or more of polarized bit channels 340. In some cases, the transmitting device and the receiving device may communicate an indication of the number of copied information bits used for generating second encoded bits 335. For instance, the transmitting device may indicate a number of copied information bits used in generating second encoded bits 335. Or the receiving device may request that a number of information bits be copied by the transmitting device in generating second encoded bits 335.

In some examples, a transmitting device determines whether to copy information bits from first polarized bit channels 315 based on determining that, for combined polarized bit channels 345, a bit channel reliability of a polarized bit channel of second polarized bit channels 340 is higher than a bit channel reliability of a polarized bit channel of first polarized bit channels 315 used to transmit an information bit. The transmitting device may also determine to which bit channels of second polarized bit channels 340 to copy information bits based on the bit channel reliabilities identified above. In some examples, determining which of second polarized bit channels 340 to copy information bits is based on one or more bit channel reliability tables stored at the transmitting device designating the locations of the bit channels for copying for a particular polar code size (e.g., 2N) and/or channel condition. In some examples, determining which of second polarized bit channels 340 to copy information bits is based on one or more tables stored at the transmitting device designating which bit channels of a combined polar code (e.g., for combined polarized bit channels 345) carry copied information bits for a particular polar code size and channel condition. In some cases, the transmitting device may explicitly indicate to the receiving device which of combined polarized bit channels 345 carry information bits. For example, the transmitting device may transmit a bitmap having N bits, where each bit corresponds to a bit channel of second polarized bit channels 340. In some examples, the transmitting device indicates that no information bits have been copied to polarized bit channels 340, as shown in FIG. 3.

A receiving device may similarly determine whether information bits have been copied for a retransmission based on determining that, for combined polarized bit channels 345, a bit channel reliability of a polarized bit channel of second polarized bit channels 340 is higher than a bit channel reliability of a polarized bit channel of first polarized bit channels 315 used to transmit an information bit. In some cases, the receiving device may determine which of second polarized bit channels 340 carry copied information bits based on an explicit indication (e.g., a bitmap) received from the transmitting device or based on tables stored at the receiving device. In some cases, the receiving device may determine which of second polarized bit channels 340 carry copied information bits based on bit channel reliability tables stored at the receiving device for a particular polar code size and channel condition (e.g., SNR value). In some cases, the receiving device may determine which of second polarized bit channels 340 carry copied information bits based on receiving an index that points to values of a table designating which bit channels of a combined polar code (e.g., for combined polarized bit channels 345) carry copied information bits for a particular polar code size and channel condition.

The receiving device may then decode second codeword 330 and may transmit an ACK to the transmitting device if second codeword 330 is properly decoded or a NAK if second codeword 330 is not successfully decoded. In some cases, the receiving device decodes second codeword 330 based on the indication of the number of copied information bits.

Figure 4:
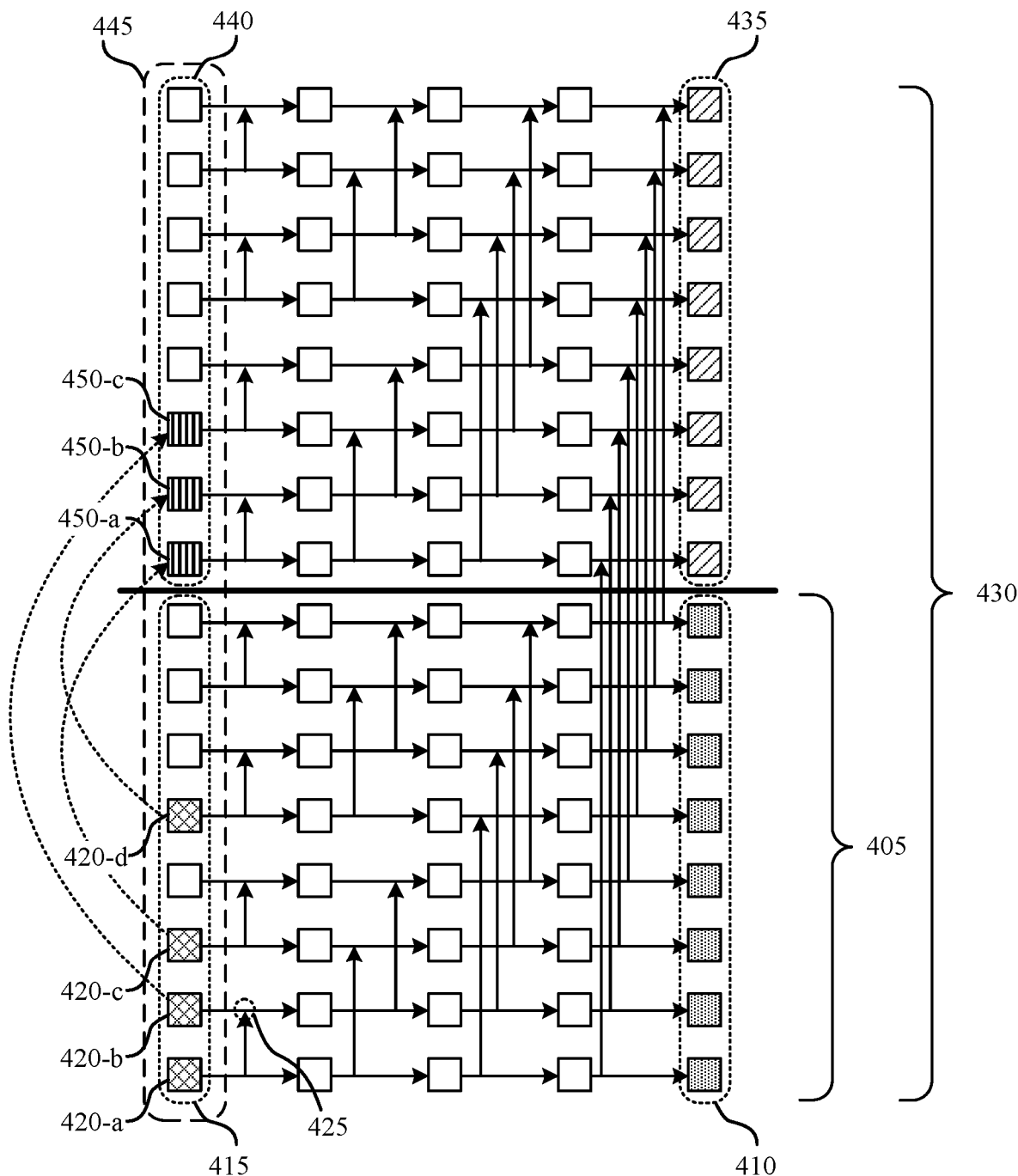

FIG. 4 illustrates an example of an encoding scheme 400 that supports indicating a number of copied information bits in a retransmission in accordance with various aspects of the present disclosure. Encoding scheme 400 may illustrate aspects of a transmission between a UE 115 and a base station 105, as described above with reference to FIGS. 1-2. Encoding scheme 400 may include first codeword 405 and second codeword 430. First codeword 405 may be composed of first encoded bits 410, which may be generated using first polarized bit channels 415, information bits 420-a to 420-d, and XOR operations 425. Second codeword 430 may be composed of first encoded bits 410 and second encoded bits 435, which may be generated using second polarized bit channels 440, XOR operations 425, first encoded bits 410, and copied information bits 450-a to 450-c. In some cases, second codeword 430 may be considered as being generated using combined polarized bit channels 445, which includes both first polarized bit channels 415 and second polarized bit channels 440.

Similar to the discussion above, a transmitting device may encode information bits 420-a to 420-b to obtain first encoded bits 410 using a polar code of size N, and may prepare a retransmission of second encoded bits 435 after applying the first encoded bits 410 to the second encoding, where the combination of the first encoded bits 410 and the second encoded bits 435 compose a second polar code of effective size 2N. Also, a transmitting device may copy one or more of information bits 420-a to 420-d (e.g., copied information bits 450-a and 450-b) to second polarized bit channels 440 when generating second encoded bits 435.

For an initial transmission, the transmitting device may map information bits 420-a to 420-d to first polarized bit channels based on first bit channel reliabilities of first polarized bit channels 415 for a first transmission. For instance, the transmitting device may map information bit 420-a to the highest reliability polarized bit channel, information bit 420-b to the second highest reliability polarized bit channel, and so on. The transmitting device may then transmit first encoded bits 410 to a receiving device. If the receiving device fails to properly decode first encoded bits 410, then the transmitting device may prepare a retransmission.

For the retransmission, the transmitting device may copy one or more of information bits 420-a to 420-d to second polarized bit channels 440 based on bit channel reliabilities of the combined polarized bit channels 445. For instance, the transmitting device may determine that the bit channel reliability of one or more of combined polarized bit channels 445—i.e., for a polar code of size 2N—is higher than that of the bit channel reliabilities that were previously determined for first polarized bit channels 415—i.e. for a polar code of size N.

The transmitting device may select one or more of the second polarized bit channels 440 as bit channel locations for copied information bits 450 for generating second encoded bits 435 based on the determination. It is worth noting that for the retransmission, the transmitting device only selects bit channel locations for copied information bits from the second polarized bit channels 440 since bit channel locations of the first polarized bit channels 415 were only available for use during the first transmission. In some examples, the transmitting device selects a first bit channel location from combined polarized bit channels 445 for first copied information bit 450-a based on determining that a reliability of the polarized bit channel of combined polarized bit channels 445 used by information bit 420-*d* is lower than a reliability of the polarized bit channel of combined polarized bit channels 445 corresponding to the first bit channel location used for first copied information bit 450-*a*. Similarly, the transmitting device may select a second bit channel location for second copied information bit 450-*b* based on determining that the reliability of the polarized bit channel used by information bit 420-*c* is lower than the reliability of the polarized bit channel corresponding to the second bit channel location used for the second copied information bit 450-*b* when considering the bit channel reliabilities of combined bit channels 445.

In some cases, the transmitting device maps the copied information bits to polarized bit channels in accordance with predetermined rules. For instance, the transmitting device may determine that if a reliability of a polarized channel of second polarized bit channels 440 is higher than a reliability of a polarized channel of first polarized bit channels 415 (e.g., based on the bit channel reliabilities of combined bit channels 445), then the information bit mapped to the lowest reliability polarized bit channel for the first transmission (e.g., the bit channel location of information bit 420-*d*) is to be mapped to the highest reliability polarized bit channel of second polarized bit channels 440 (e.g., the bit channel location of information bit 450-*a*).

The transmitting device may transmit second encoded bits 435 to the receiving device in a retransmission. The receiving device may receive second encoded bits 435 and may combine second encoded bits 435 with first encoded bits 410 to create second codeword 430. The receiving device may have a higher likelihood of decoding second codeword 430 since each received bit in a polar coded transmission may provide additional information for decoding another bit. In some examples, the receiving device determines a number of copied information bits that were used and identifies bit channel locations of the copied information bits 450-*a* and 450-*b*. For instance, the receiving device may determine the number of copied information bits by calculating the bit channel reliabilities of first polarized bit channels 415 within combined polarized bit channels 445. The receiving device may then determine whether a reliability of one or more bit channels of second polarized bit channels 440 within combined polarized bit channels 445 are higher than the reliability of one or more bit channels of first polarized bit channel 415. The receiving device may then determine which information bits are mapped to which bit channels of second polarized bit channel 440—e.g., according to a predetermined rule. For example, the receiving device may determine that the information bit in the lowest reliability bit channel of first polarized bit channels 415 of combined polarized bit channels 445 (e.g., information bit 420-*d*) has been copied to the highest reliability bit channel of second polarized bit channels 440 of combined polarized bit channels 445 (e.g., the bit channel location of copied information bit 450-*a*).

In some cases, the channel conditions and/or the transmission parameters for the transmission of second encoded bits 435 are different than the channel conditions and/or the transmission parameters for the transmission of first encoded bits 410. In some examples, only one of the transmitting device or the receiving device may identify that there has been a change in channel conditions or transmission parameters. For instance, a receiving device may identify a change in channel conditions after decoding reference signals or a transmitting device may make a unilateral decision to increase a transmit power. The change in channel conditions or transmission parameters may result in different bit channel reliabilities of combined polarized bit channels 445. Thus, the number of information bits that are copied, or expected to be copied, to second polarized bit channels 440 may change based on calculations at the device that observes the change in channel conditions or transmission parameters. But since the other device may be unaware of the change in channel conditions or transmission parameters, the other device may determine, assuming that channel conditions and the transmission parameters haven't changed, that a different number of information bits are expected to be copied to second polarized bit channels 440. Thus, the transmitting device and the receiving device may communicate with one another the number of information bits that are copied to second polarized bit channels 440. For instance, a transmitting device may indicate to a receiving device the number of information bits that are copied to second polarized bit channels 440—e.g., based on identifying a change in channel conditions or modifying a transmit power. Or a receiving device may indicate to the transmitting a request that a number of information bits be copied to second polarized bit channels 440—e.g., based on identifying a change in channel conditions.

In some examples, the transmitting device may observe more favorable channel conditions (e.g., decreased interference) for transmitting second encoded bits 435. The favorable channel conditions may result in more bit channels of second polarized bit channels 440 having higher bit channel reliabilities than if the channel conditions had been unchanged. For instance, a third bit channel of second polarized bit channels 440 may be identified as having a higher channel reliability than the bit channel of first polarized bit channel 415 used for information bit 420-*b*. Thus, information bit 420-*b* may be copied to the polarized bit channel carrying copied information bit 450-*c*. Similarly, the transmitting device may identify that a third bit channel of second polarized bit channels 440 has a higher channel reliability than the bit channel of first polarized bit channel 415 used for information bit 420-*b* based on boosting a transmit power for the transmission of second encoded bits 435, and may copy information bit 420-*b* to the polarized bit channel carrying copied information bit 450-*c*.

The receiving device may not observe or be aware of the more favorable channel conditions for transmitting second encoded bits 435, and therefore, may only expect two copied information bits, e.g., copied information bit 450-*a* and 450-*b*, to be used in generating second encoded bits 435. In some cases, the transmitting device may also indicate a number of information bits that were copied to second polarized bit channels 440 to the receiving device. By indicating the number of information bits, the receiving device may identify that the number of expected bits to be copied is different than the number of bits that were actually copied.

In some cases, the receiving device identifies which bit channels of second polarized bit channels 440 carried copied information bits based on a predetermined rule or set of rules. For instance, if an indicated number of copied information bits differs from a calculated number of copied information bits, the receiving device may assume that the additional copied information bits, such as copied information bit 450-*c*, are mapped to the next highest reliability bit channel of second polarized bit channels 440, where the reliabilities of second polarized bit channels 440 are calculated for the original channel conditions or transmission parameters. For example, the receiving device may expect two copied information bits, but may receive an indication that there are three copied information bits in a retransmission. The receiving device may then calculate the reliabilities of combined polarized bit channels 445 according to the same channel conditions and transmission parameters of the first transmission. The receiving device may then determine that the bit channel of second polarized bit channels 440 with the third highest reliability carried a copied information bit. The receiving device may then identify bit channel locations, or polarized bit channels of second polarized bit channels 440 that correspond to the copied information bits, and may decode second codeword 430 based on the identified bit channel location.

In some cases, the receiving device identifies which bit channels of second polarized bit channels 440 carried copied information bits based on an iterative process. For instance, the receiving device may identify that the number of expected copied information bits and the indicated number of copied information bits is different. The receiving device may then iteratively assume different channel conditions (e.g., may incrementally increase an SNR) and/or transmission parameters (e.g., may incrementally increase a transmission power) until the number of expected copied information bits matches the indicated number of copied information bits. The receiving device may then identify bit channel locations, or polarized bit channels of second polarized bit channels 440 that correspond to the copied information bits, and may decode second codeword 430 based on the identified bit channel location. In some cases, the receiving device may identify the bit channel reliabilities for the different channel conditions or transmission parameter by calculation (e.g., density evolution, polarization weight, etc.). In other cases, the receiving device may apply bit channel reliabilities from tables determined according to different SNR levels for the second encoded bits 435 than the first encoded bits 410. For example, the receiving device may be configured with tables with SNR factors for various combinations of bit channels. In such cases, a receiving device may identify a SNR level for a channel (e.g., based on internal calculations or receiving an indication of the SNR level from a transmitting station) and may determine bit channel reliabilities for a polar code of size N based on a stored table that lists the bit channel reliabilities for each of the N bit channels for the particular SNR level. In some cases, a receiving device receives an index, where different indices correspond to different tables conveying bit reliabilities for a polar code of size N at different SNR levels.

In some cases, the receiving device identifies which bit channels of second polarized bit channels 440 carried copied information bits based on receiving an explicit indication of the bit channels used by the copied information bits. For instance, the receiving device may receive from the transmitting device an indication of both the number of copied information bits and bit channel locations of the copied information bits. For example, the receiving device may receive a bitmap from the transmitting device indicating which bit channels carry copied information bits. In some cases, the receiving device receives a bit map having N bits where bits in the bitmap carrying a logic 1 correspond to a bit channel carrying a copied bit. For example, for an initial code of size 8, the receiving device may receive a bitmap having 8 bits (e.g., {1,1,0,0,0,0,0,0}) with a first retransmission. The receiving device may then determine that two bits have been copied to the first two bit channels of the top half of the second codeword 430. For a second retransmission, the receiving device may similarly determine that two bits have been copied to the first two bit channels of the top third of a third polar code. In some cases, the receiving device may also receive an indication of, or keep track of, which retransmission is being transmitted. The receiving device may then decode second codeword 430 based on the indicated number of copied information bits and bit channel locations.

In some examples, the receiving device may observe more favorable channel conditions (e.g., decreased interference) for transmitting second encoded bits 435 than the channel conditions for transmitting first encoded bits 410. The receiving device may request that the transmitting device copy a number of information bits for generating second encoded bits based on bit channel reliabilities of combined polarized bit channels 445 under the more favorable channel conditions. In some examples, the transmitting device prepares the retransmission based on the number of copied information bits requested by the receiving device. In some examples, first encoded bits 410 or second encoded bits 435 include a subset of the encoded bits created using the corresponding polar code operation. For example, one or more of the first or second encoded bits may be punctured for rate matching. Alternatively, one or more of the first encoded bits 410 or second encoded bits 435 may be repeated for rate matching.

Figure 5:
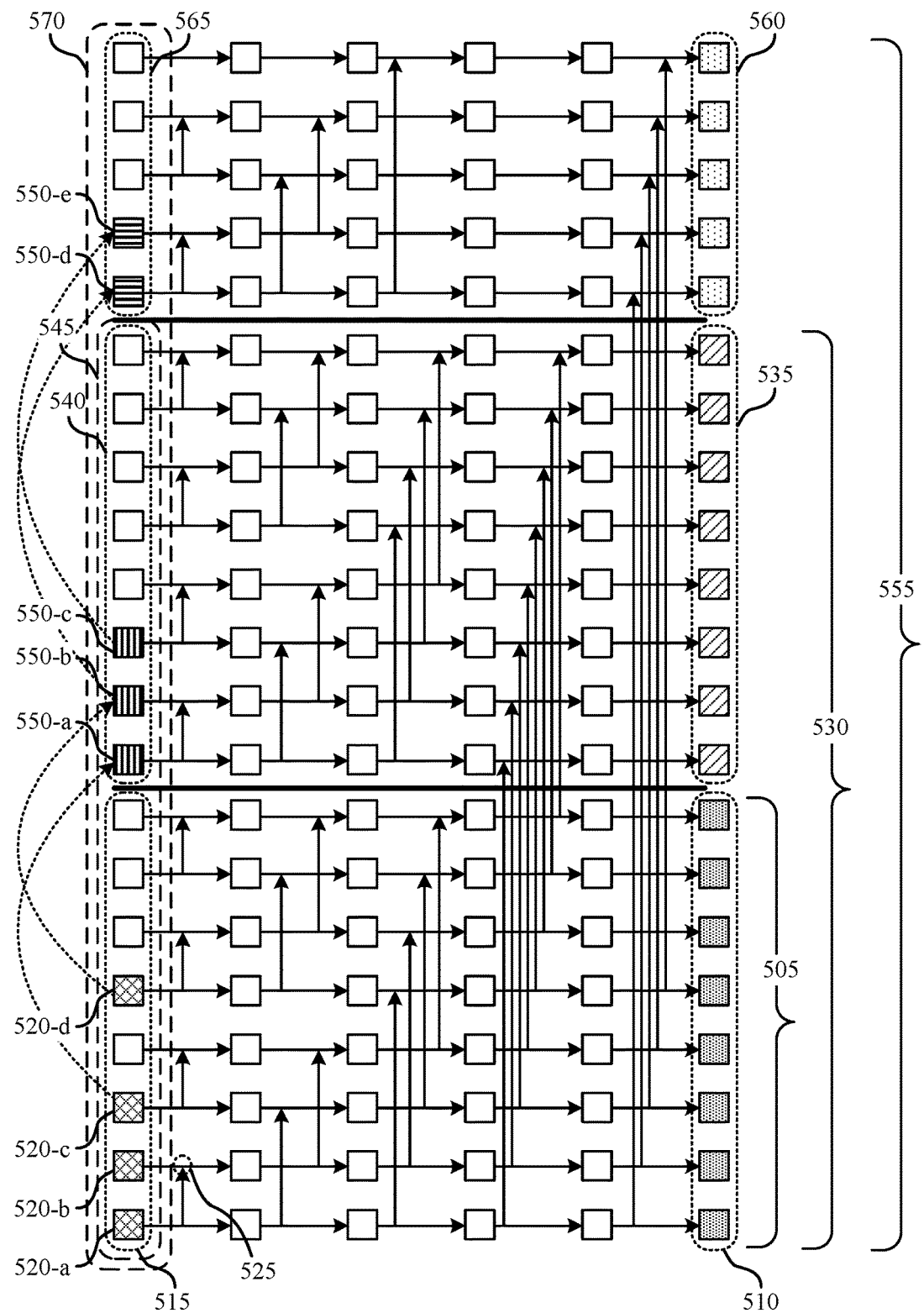

FIG. 5 illustrates an example of an encoding scheme 500 that supports indicating a number of copied information bits in a retransmission in accordance with various aspects of the present disclosure. Encoding scheme 500 may illustrate aspects of a transmission between a UE 115 and a base station 105, as described above with reference to FIGS. 1-2. Encoding scheme 500 may include first codeword 505, second codeword 530, and third codeword 555. First codeword 505 may be composed of first encoded bits 510, which may be generated using first polarized bit channels 515, information bits 520-a to 520-d, and XOR operations 525. Second codeword 530 may be composed of first encoded bits 510 and second encoded bits 535, which may be generated using second polarized bit channels 540, XOR operations 525, first encoded bits 510, and copied information bits 550-a and 550-b. In some cases, second codeword 530 may be considered as being generated using combined polarized bit channels 545, which includes both first polarized bit channels 515 and second polarized bit channels 540.

Third codeword 555 may be composed of first encoded bits 510, second encoded bits 535, which may be generated using second polarized bit channels 540, third encoded bits 560, which may be generated using third polarized bit channels 565, XOR operations 525, first encoded bits 510, second encoded bits 535, and copied information bits 550-d and 550-e. And third codeword 555 may be considered as being generated using combined polarized bit channels 570, which includes all of first polarized bit channels 515, second polarized bit channels 540, and third polarized bit channels 565. In some examples, third encoded bits 560 are a subset of the encoded bits created using the third polar code operation. For example, one or more of the third encoded bits 560 may be punctured to accommodate rate matching. Alternatively, one or more of the third encoded bits 560 may be repeated for rate matching.

Like in FIG. 4, a transmitting device may transmit information bits in a first transmission, using a polar code of size N, to a receiving device and a first retransmission, using a polar code of size 2N, to the receiving device when the decoding of the first transmission fails at the receiving device. In some cases, the transmitting device may copy one or more of the information bits to polarized bit channels used to generate a second transmission. In some examples, the number of information bits copied to the polarized bit channels is based on changed channel conditions and/or changed transmission parameters, which in some cases may be known to only one of the transmitting or receiving device. Thus, the device that identifies the changes may indicate to the other device a requested number of copied information bits, or a number of copied information bits included, in a retransmission. The other device may then transmit or receive the retransmission based on the indicated number of copied information bits.

In some cases, the receiving device fails to decode the retransmission. After determining that the decoding has failed the transmitting device may transmit a second retransmission, which may include third encoded bits 560. Similar to the generation of second encoded bits 535, the transmitting device may generate third encoded bits by copying one or more of copied information bits 550-*a* to 550-*c* to a bit channel of third polarized bit channels 565. The receiving device may receive third encoded bits 560 and may combine third encoded bits 560 with second encoded bits 535 and first encoded bits 510 to create a third codeword 555, which the receiving device may then decode.

As discussed above, the transmitting device may determine a number of copied information bits 550-*a* to 550-*c* to copy to polarized bit channels of polarized bit channels 565 based on a change in channel conditions or transmission parameters—relative to either the first transmission or the first retransmission—that may be unknown to the receiving device. Thus, the transmitting device may indicate the number of copied information bits to be used for generating third encoded bits 560 to the receiving device. The receiving device may determine that the indicated number of copied information bits is different than an expected number of copied information bits and may identify the bit channel locations, or bit channels of third polarized bit channels 565, of the additional, or unexpected, copied information bits based on a predetermined set of rules, an iterative identification process, or an explicit indication of the bit channel locations.

In some cases, the receiving device may determine a number of copied information bits 550-*a* to 550-*c* to copy to polarized bit channels of polarized bit channels 565 based on a change in channel conditions or transmission parameters that may be unknown to the transmitting device. The receiving device may request that the transmitting device copy the determined number of information bits in generating the retransmission. The transmitting device may determine that the requested number of copied information bits is different than an expected number of copied information bits and may identify bit channel locations, or bit channels of third polarized bit channels 565, for the additional, or unexpected, copied information bits based on a predetermined set of rules, an iterative identification process, or an explicit indication of the bit channel locations, as discussed above.

Figure 6:
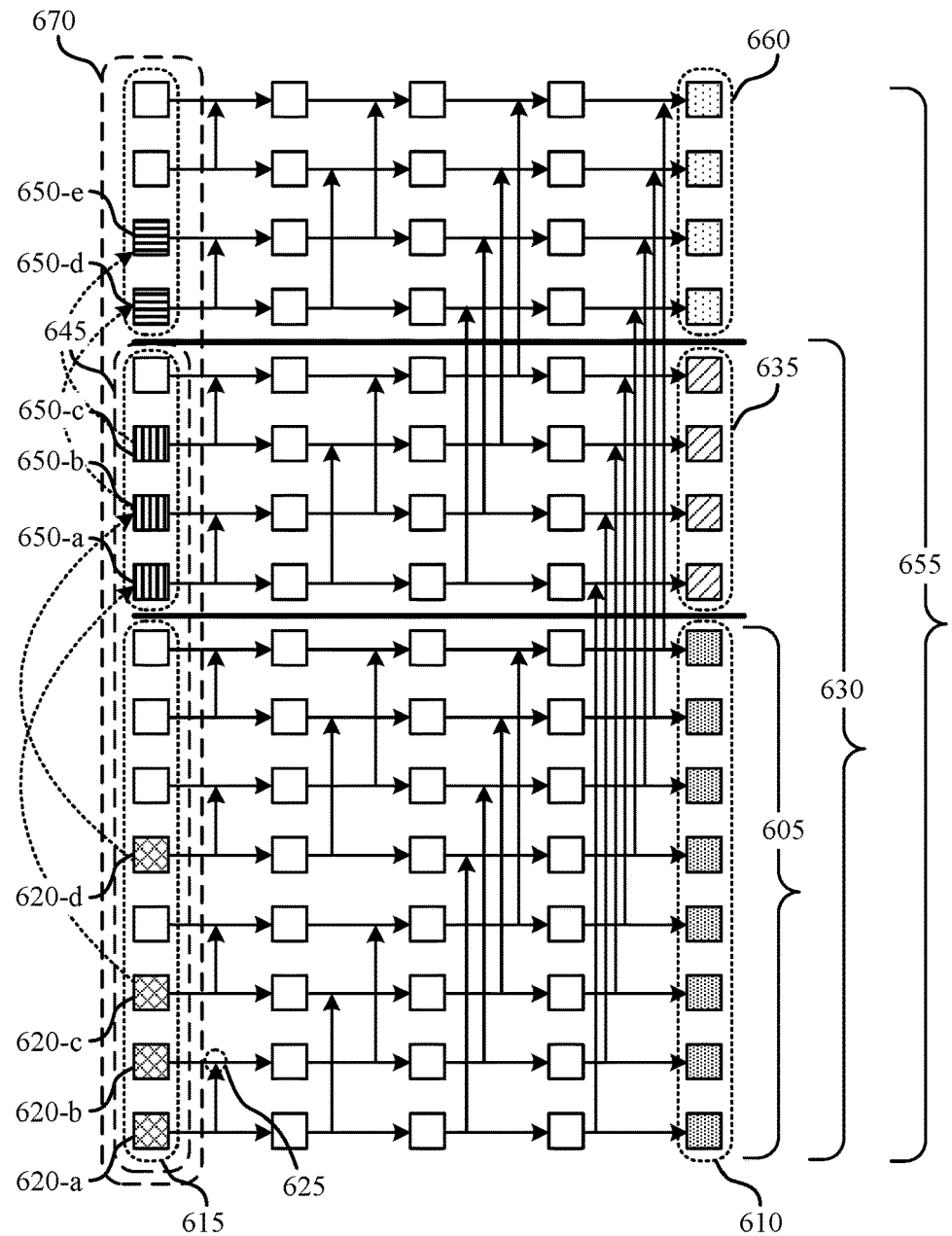

FIG. 6 illustrates an example of an encoding scheme 600 that supports indicating a number of copied information bits in a retransmission in accordance with various aspects of the present disclosure. Encoding scheme 600 may illustrate aspects of a transmission between a UE 115 and a base station 105, as described above with reference to FIGS. 1-2. Encoding scheme 600 may include first codeword 605, second codeword 630, and third codeword 655. First codeword 605 may be composed of first encoded bits 610, which may be generated using first polarized bit channels 615, information bits 620-*a* to 620-*d*, and XOR operations 625.

Second codeword 630 may be composed of first encoded bits 610 and second encoded bits 635, which may be generated using second polarized bit channels 640, XOR operations 625, first encoded bits 610, and copied information bits 650-*a* and 650-*b*. In some cases, second codeword 630 may be considered as being generated using combined polarized bit channels 645, which includes both first polarized bit channels 615 and second polarized bit channels 640. In some examples, second encoded bits 635 are a subset of the encoded bits created using the second polar code operation. For example, one or more of the second encoded bits 635 may be punctured to accommodate rate matching. Alternatively, one or more of the second encoded bits 635 may be repeated for rate matching.

Third codeword 655 may be composed of first encoded bits 610, second encoded bits 635, which may be generated using second polarized bit channels 640, third encoded bits 660, which may be generated using third polarized bit channels 665, XOR operations 625, first encoded bits 610, second encoded bits 635, and copied information bits 650-*d* and 650-*e*. And third codeword 655 may be considered as being generated using combined polarized bit channels 670, which includes all of first polarized bit channels 615, second polarized bit channels 640, and third polarized bit channels 665. In some examples, third encoded bits 660 are a subset of the encoded bits created using the third polar code operation. For example, one or more of the third encoded bits 660 may be punctured to accommodate rate matching. Alternatively, one or more of the third encoded bits 660 may be repeated for rate matching. In some cases, a second to last stage of the second polar code operation is XOR'ed with a second to last stage of the third polar code operation. And the output of the first polar code operation is XOR'ed with the outputs of the second and third polar code operations that are not punctured.

As discussed above, a transmitting device may identify a number of information bits to copy to polarized bit channels of a polar code used to generate a retransmission. In some cases, the transmitting device may identify the number of information bits to copy based on a change in channel conditions or transmission parameters that is known only to the transmitting device or based on receiving an indication of a change in channel conditions from a receiving device that are known only to the receiving device. In some cases, the transmitting device may indicate the number of copied information bits to a receiving device, which may use the indication to determine whether unexpected information bits have been copied to unexpected polarized bit channels used to generate a retransmission. In some cases, a receiving device may request that a transmitting device copy a number of information bits to generate a retransmission, and the transmitting device may determine whether unexpected information bits are to be copied to unexpected polarized bit channels prior to performing the retransmission.

Figure 7A:
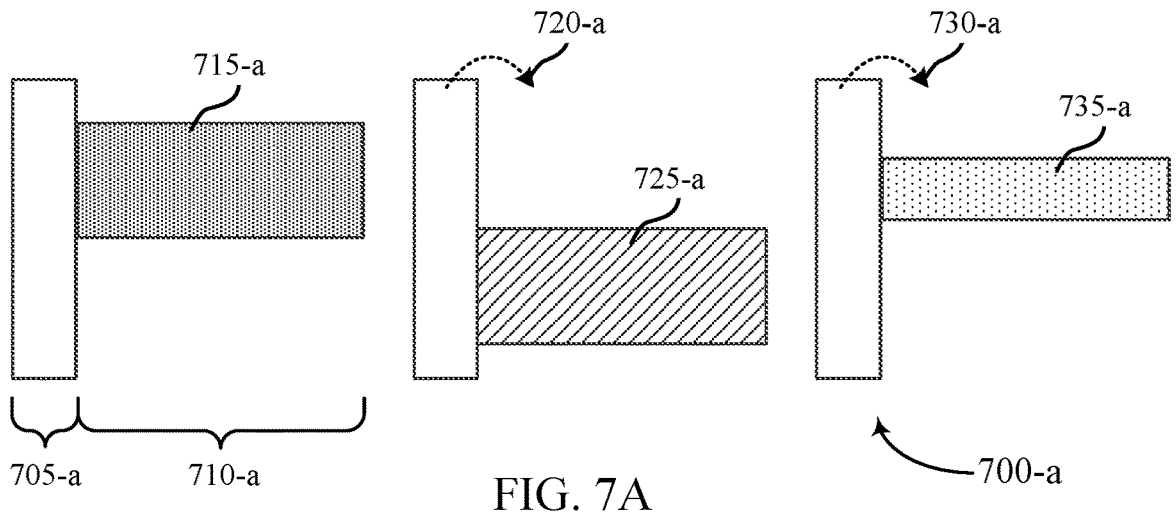
FIGS. 7A to 7C illustrate example resource allocations that support indicating a number of copied information bits in a retransmission in accordance with various aspects of the present disclosure.

FIG. 7A illustrates an example of a resource allocation 700-*a* that supports indicating a number of copied information bits in a retransmission in accordance with various aspects of the present disclosure. Resource allocation 700-*a* may illustrate aspects of a transmission between a UE 115 and a base station 105, as described above with reference to FIGS. 1-2. Resource allocation 700-*a* may include downlink control channels 705-*a*, downlink data channels 710-*a*, first transmission 715-*a*, first indicator 720-*a*, first retransmission 725-*a*, second indicator 730-*a*, and second retransmission 735-*a*.

Downlink control channels 705-*a* may carry downlink control information (DCI), such as scheduling information, transmit power commands, frequency hopping information, HARQ information, and the like, associated with a transmission to a UE. DCI may also include control information associated with an uplink transmission from a UE, such as an uplink resource allocation or HARQ feedback.

In some cases, the DCI included in downlink control channels 705-a may include first indicator 720-a or second indicator 730-a. First indicator 720-a and second indicator 730-a may include an indication of a number of copied information bits in a retransmission. First indicator 720-a and second indicator 730-a may optionally include an indication of the polarized bit channels used by the copied information bits or an indication of a change in channel conditions or transmission parameters. In some cases, first indicator 720-a and second indicator 730-a include an index that is used to identify different bit channel reliability tables (e.g., different tables for different polar code sizes and/or SNR levels). In some cases, first indicator 720-a and second indicator 730-a include a bitmap having N bits, each bit indicating whether a corresponding bit channel of a polar code carries copied information bits.

Downlink data channels 710-a may carry downlink data to a UE. A base station may transmit transmissions, such as first transmission 715-a, first retransmission 725-a, and second retransmission 735-a to the UE. In some cases, the DCI indicates to the UE which time and frequency resources in a downlink data channel 710-a have been allocated to a data transmission intended for the UE. For instance, DCI may indicate a time and frequency bit channel location of resources assigned to first transmission 715-a.

In some examples, a base station identifies that there is data available to send to a UE and schedules a downlink transmission of the data to the UE. The base station may transmit DCI to the UE over a downlink control channel 705-a that indicates a bit channel location of downlink resources allocated to first transmission 715-a in a downlink data channel 710-a. Prior to transmitting the data in first transmission 715-a, the base station may encode information bits representing the data using a polar code of a first size (e.g., N). The UE may receive and attempt to decode first transmission 715-a based on the received DCI. In some cases, the UE may indicate to the base station that the decoding failed.

After receiving the indication of the failed decoding, the base station may prepare a first retransmission 725-a. The base station may determine a number of information bits to copy to a polar code of an effective second size (e.g., 2N) when generating first retransmission 725-a. As discussed above, the base station may determine the number of information bits to copy to the polar code based on changed channel conditions or modified transmission parameters that are unknown to the UE. In some examples, the base station does not copy any information bits. The UE may also determine a number of copied information bits to expect in first retransmission 725-a. In some cases, the number of copied information bits expected by the UE is different than the number of copied information bits used in generating first retransmission 725-a.

The base station may transmit an indication of the number of copied information bits to the UE in first indicator 720-a. The UE may receive first retransmission 725-a and decode first retransmission 725-a based on first indicator 720-a. In some cases, the UE may process first indicator 720-a prior to decoding first retransmission 725-a. In some examples, the UE may determine that the number of copied information bits indicated in first indicator 720-a is different than the number of copied information bits expected by the UE in first retransmission 725-a. The UE may determine that the copied information bits are mapped to polarized bit channels of the polar code of the effective second size differently than expected based on identifying that the indicated number of copied information bits is different than the expected number of copied information bits. The UE may then identify which bit channel locations—i.e., which polarized bit channels of the polar code of the effective second size—carry the copied information bits. As discussed above, the UE may determine the bit channel locations of the copied information bits based on a predetermined set of rules, an iterative process, an explicit indication of bit channel location, or an indication of a change in channel conditions or transmission parameters.

In some examples, the UE also fails to decode first retransmission 725-a and transmits a NAK to the base station. The base station may prepare a second retransmission 735-a based on receiving the NAK. The base station may similarly copy one or more information bits for generating the second retransmission 735-a using a polar code of an effective third size (e.g., 4N). In some cases, the base station copies the one or more information bits based on changed channel conditions or modified transmission parameters. In some examples, the base station does not copy any information bits. In some cases, the second retransmission 735-a includes a smaller number of encoded bits (e.g., for rate matching purposes or to more efficiently use resources). The base station may again indicate the number of copied information bits included in second retransmission 735-a using second indicator 730-a. The UE may receive and decode second retransmission 735-a based on the received indicator. For example, the UE may identify that additional or fewer copied information bits than expected are included in second retransmission 735-a and may identify which polarized bit channels of the polar code of the third effective size carry which information bits using a predetermined rule, explicit indication, or iterative process.

Although the above is generally discussed in the context of a base station transmitting data to a UE using a downlink control and data channel, a UE may use similar techniques to transmit data to the base station using an uplink control and data channel.

Figure 7B:
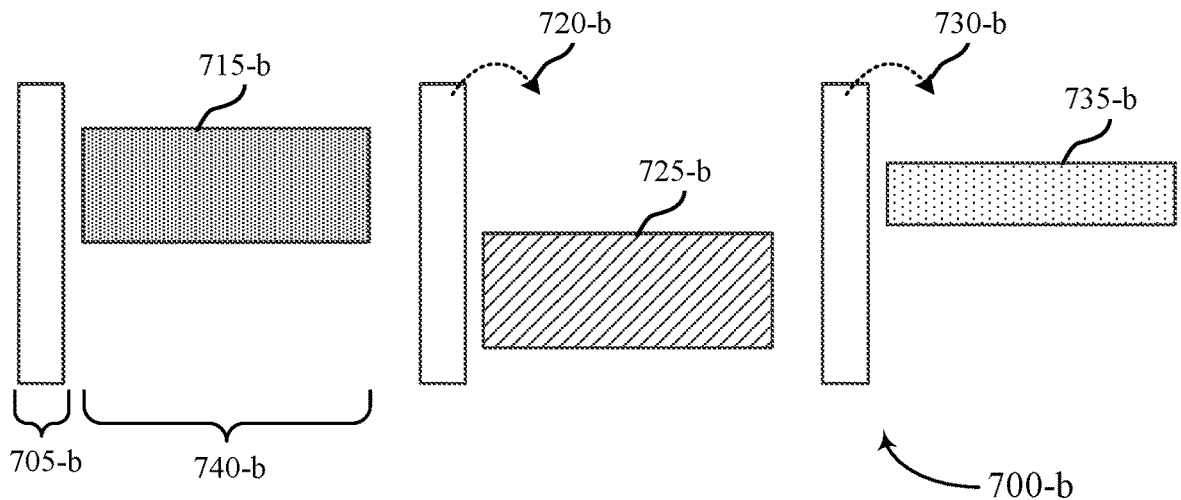

FIG. 7B illustrates an example of a resource allocation 700-a that supports indicating a number of copied information bits in a retransmission in accordance with various aspects of the present disclosure. Resource allocation 700-b may include downlink control channels 705-b, first transmission 715-b, first indicator 720-b, first retransmission 725-b, second indicator 730-b, second retransmission 735-b, and uplink data channels 740-b.

Downlink control channels 705-b, first indicator 720-b, first retransmission 725-b, second indicator 730-b may be similar to the downlink control channels 705-a, first indicator 720-a, first retransmission 725-a, and second indicator 730-a of FIG. 7A. First transmission 715-b, first indicator 720-b, first retransmission 725-b, second indicator 730-b, and second retransmission 735-b may be similar to the first transmission 715-a, first indicator 720-a, first retransmission 725-a, second indicator 730-a, and second retransmission 735-a of FIG. 7A but may be transmitted over an uplink data channel 740-b.

In some examples, a UE identifies that there is data available to send to a base station. After identifying the data the UE may request that the base station schedule uplink resources for first transmission 715-b of the data or may wait for previously or periodically scheduled uplink resources. The UE may receive, over a downlink control channel 705-b, DCI from the base station that schedules resources for the first transmission 715-b of the data over uplink data channel 740-b. Prior to transmitting the data in first transmission 715-*b*, the UE may encode information bits representing the data using a polar code of a first size. The base station may receive and attempt to decode first transmission 715-*b*. In some cases, the base station may indicate to the base station that the decoding failed.

After receiving the indication of the failed decoding, the UE may prepare a first retransmission 725-*b* using a polar code of a second effective size. In some cases, the base station may determine a number of information bits that are expected to be copied to the polar code of the second effective size based on changed channel conditions that are unknown to the UE. In some examples, the base station may indicate the number of information bits to the UE in first indicator 720-*b*. The UE may also determine a number of information bits to copy to the polar code of an effective second size when generating first retransmission 725-*b*. However, as stated above, the UE may determine a different number of information bits to copy for first retransmission 725-*b* than the base station if the changed channel conditions observed by the base station are not also observed by the UE.

In some examples, the UE compares the determined number of copied information bits with the number of copied information bits indicated by the base station. In some cases if the numbers are different, then the UE may copy the indicated number of information bits when generating first retransmission 725-*b*. As discussed above, the UE may identify bit channel locations, or polarized bit channels of the polar code of the effective second size, for the indicated number of information bits using predetermined rules, an iterative process, based on explicit bit channel location indications, or indications of a change in channel conditions or transmission parameters.

The UE may similarly transmit second retransmission 735-*b* if the UE fails to decode first retransmission 725-*b*.

Figure 7C:
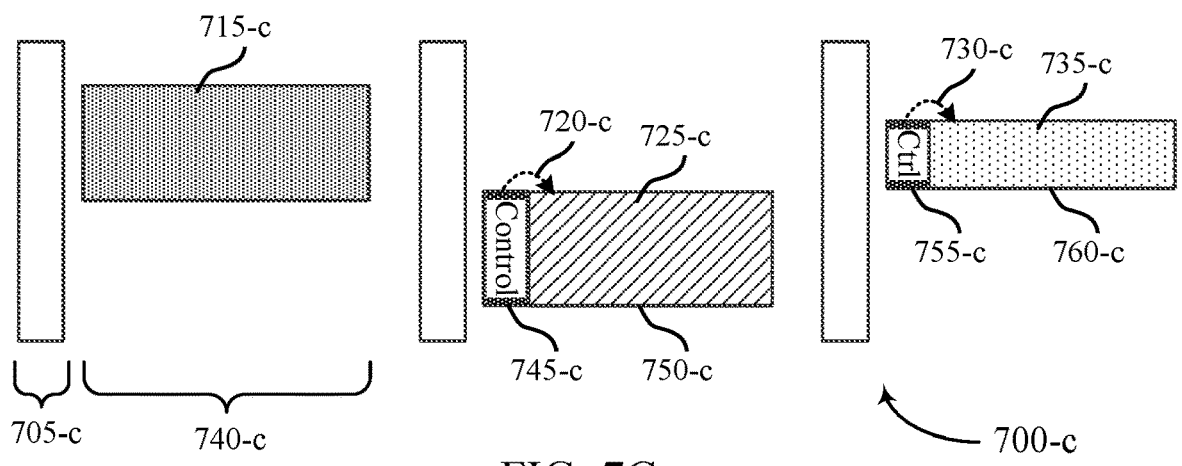

FIG. 7C illustrates an example of a resource allocation 700-*a* that supports indicating a number of copied information bits in a retransmission in accordance with various aspects of the present disclosure. Resource allocation 700-*c* may include downlink control channels 705-*c*, first transmission 715-*c*, first indicator 720-*c*, first retransmission 725-*c*, second indicator 730-*c*, second retransmission 735-*c*, uplink data channels 740-*c*, first control portion 745-*c*, first data portion 750-*c*, second control portion 755-*c*, and second data portion 760-*c*.

Downlink control channels 705-*c*, first indicator 720-*c*, first retransmission 725-*c*, second indicator 730-*c* may be similar to the downlink control channels 705-*a* or 705-*b*, first indicator 720-*a* or 720-*b*, first retransmission 725-*a* or 725-*b*, and second indicator 730-*a* or 730-*b* of FIG. 7A. First transmission 715-*c*, first indicator 720-*c*, first retransmission 725-*c*, second indicator 730-*c*, and second retransmission 735-*c* may be similar to the first transmission 715-*a* or 715-*b*, first indicator 720-*a* or 720-*b*, first retransmission 725-*a* or 725-*b*, second indicator 730-*a* or 730-*b*, and second retransmission 735-*a* or 735-*b* of FIG. 7A but may be transmitted over an uplink data channel 740-*c*.

First retransmission 725-*c* may include a first control portion 745-*c* and a first data portion 750-*c*, and second retransmission 735-*c* may include a second control portion 755-*c* and a second data portion 760-*c*. In some examples, the information in first control portion 745-*c* is encoded separately from the information in first data portion 750-*c* of first retransmission 725-*c*. Similarly, the information in second control portion 755-*c* may be encoded separately from the information in second data portion 760-*c* of second retransmission 735-*c*. By encoding the information separately, a receiving device may decode the information in the control portion separately from the information in the data portion, which may be beneficial when decoding the information in the data portion is dependent on the information in the control portion.

In some examples, a UE identifies that there is data available to send to a base station. After identifying the data the UE may request that the base station schedule uplink resources for first transmission 715-*c* of the data or may wait for previously or periodically scheduled uplink resources. The UE may receive, over a downlink control channel 705-*c*, DCI from the base station that schedules resources for the first transmission 715-*c* of the data over uplink data channel 740-*c*. Prior to transmitting the data in first transmission 715-*c*, the UE may encode information bits representing the data using a polar code of a first size. The base station may receive and attempt to decode first transmission 715-*c*. In some cases, the base station may indicate to the UE that the decoding failed.

After receiving the indication of the failed decoding, the UE may prepare a first retransmission 725-*c* using a polar code of a second effective size. In some cases, the UE may determine a number of information bits to copy to the polar code of the second effective size used for generating first retransmission 725-*c* based on changed channel conditions or transmission parameters that are unknown to the base station. In some examples, the UE may indicate the number of copied information bits to the base station in first indicator 720-*c*. In some cases, first indicator 720-*c* also includes an indication (e.g., a bitmap as discussed above) of which bit channels of the polar code of the second effective size are carrying copied information bits.

The base station may also determine a number of information bits expected to be copied to the polar code of an effective second size when UE generates first retransmission 725-*c*. However, as stated above, the UE may determine a different number of information bits to copy for first retransmission 725-*c* than the base station if the changed channel conditions observed by the UE are not also observed by the base station, or if the UE unilaterally changes a transmission parameter.

The UE may transmit first retransmission 725-*c* to the base station based on encoding first retransmission 725-*c* using the determined number of copied information bits. The UE may also transmit an indication of the number of copied information bits to the base station in first indicator 720-*c*. The base station may receive first retransmission 725-*c* and decode first retransmission 725-*c* based on first indicator 720-*c*. In some cases, the base station may process first indicator 720-*c* prior to decoding first data portion 750-*c* of first retransmission 725-*c*—e.g., the base station may decode first indicator 720-*c* independently from decoding first data portion 750-*c*. In some examples, the base station may determine that the number of copied information bits indicated in first indicator 720-*c* is different than the number of copied information bits expected to be used in generating first retransmission 725-*c*. The base station may determine that the copied information bits are mapped to polarized bit channels of the polar code of the effective second size differently than expected based on identifying that the indicated number of copied information bits is different than the expected number of copied information bits. The base station may then identify which bit channel locations—i.e., which polarized bit channels of the polar code of the effective second size—carry the copied information bits. As discussed above, the base station may determine the bit channel locations of the copied information bits based on a predetermined set of rules, an iterative process, an explicit indication of bit channel location, or an indication of a change in channel conditions or transmission parameters.

Figure 8:
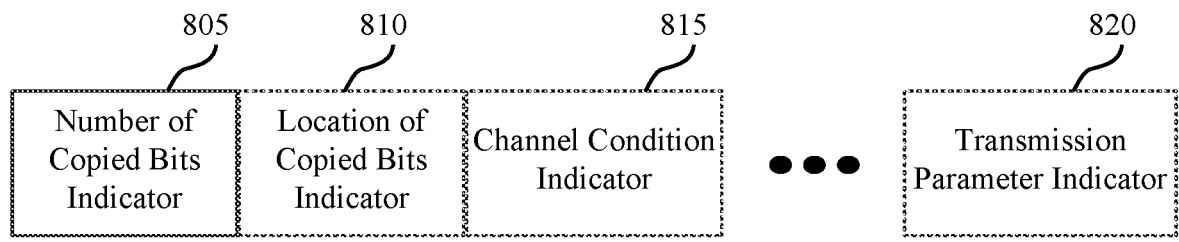
FIG. 8 illustrates an example of an indicator for indicating a number of copied information bits in a retransmission in accordance with various aspects of the present disclosure.

FIG. 8 illustrates an example of an indicator 800 for indicating a number of copied information bits in a retransmission in accordance with various aspects of the present disclosure. Indicator 800 may illustrate aspects of a transmission between a UE 115 and a base station 105, as described above with reference to FIGS. 1-2. Indicator 800 may include one or more of the following: copied information bit indicator 805, bit channel location indicator 810, channel condition indicator 815, and transmission parameter indicator 820.

Copied information bit indicator 805 may indicate the number of copied information bits for generating a subsequent, or corresponding, retransmission. In some examples, a transmitting or receiving device determines the number of copied information bits based on a change in channel conditions or transmission parameters. In some cases, a transmitting device uses copied information bit indicator 805 to indicate a number of copied information bits included in a retransmission. In other cases, a receiving device uses copied information bit indicator 805 to request that the transmitting device copy a number of bits when generating the retransmission.

Bit channel location indicator 810 may indicate which polarized bit channels of a polar code used for generating the retransmission carry which copied information bits. In some examples, bit channel location indicator 810 may request that certain polarized bit channels of a polar code used for generating the retransmission carry certain copied information bits. In some cases, the bit channel location indicator 810 may reduce overhead by indicating the polarized channels that correspond only to the additional, or unexpected copied information bits. In some examples, bit channel location indicator 810 carries an index that corresponds to different bit channel reliability tables for different SNR levels and/or polar code sizes. A receiving device may use the number of bits indicated in the copied information bit indicator 805 and the index to identify which bit channels carry copied information bits. For instance, a receiving device may determine that two bits have been copied and may determine which bits channels carry copied bits based on the bit channel reliability table indicated by the bitmap according to a predetermined set of rules. In other examples, bit channel location indicator 810 carries a bitmap having N bits, each bit corresponding to a bit channel of a polar code of size N. For a first retransmission, the N bits in the bitmap may correspond to a top half of a polar code of size 2N. For a second retransmission, the N bits in the bitmap may correspond to a top third of a polar code of size 3N.

In some cases, a bitmap explicitly indicating which bit channels carry copied information bits is sent in a single field that performs the functions of both the copied information bit indicator 805 and the channel location indicator 810.

Channel condition indicator 815 may indicate a change in channel conditions between transmitting the first transmission and transmitting the second transmission. In some cases, channel condition indicator 815 indicates an SNR or SINR level associated with the second transmission, and the device that receives the indicated SNR level calculates a number of bits to copy and identifies polarized bit channels of the polar code used for generating the transmission based on the indicated SNR. In some examples, a transmitting device uses channel condition indicator 815 to indicate observed changes in channel conditions. In other examples, the receiving device uses channel condition indicator 815 to indicate observed changes in channel conditions.

Transmission parameter indicator 820 may indicate a change in transmission parameters between transmitting the first transmission and transmitting the second transmission. In some examples, a transmitting device transmits the retransmission using different transmission parameters than for the first transmission. In some cases, transmission parameter indicator 820 indicates change in the transmit parameter or indicates an modulation and coding scheme (MCS) value used for the retransmission, and the device that receives the indication calculates a number of bits to copy and identifies polarized bit channels of the polar code used for generating the transmission based on the indication.

Figure 9:
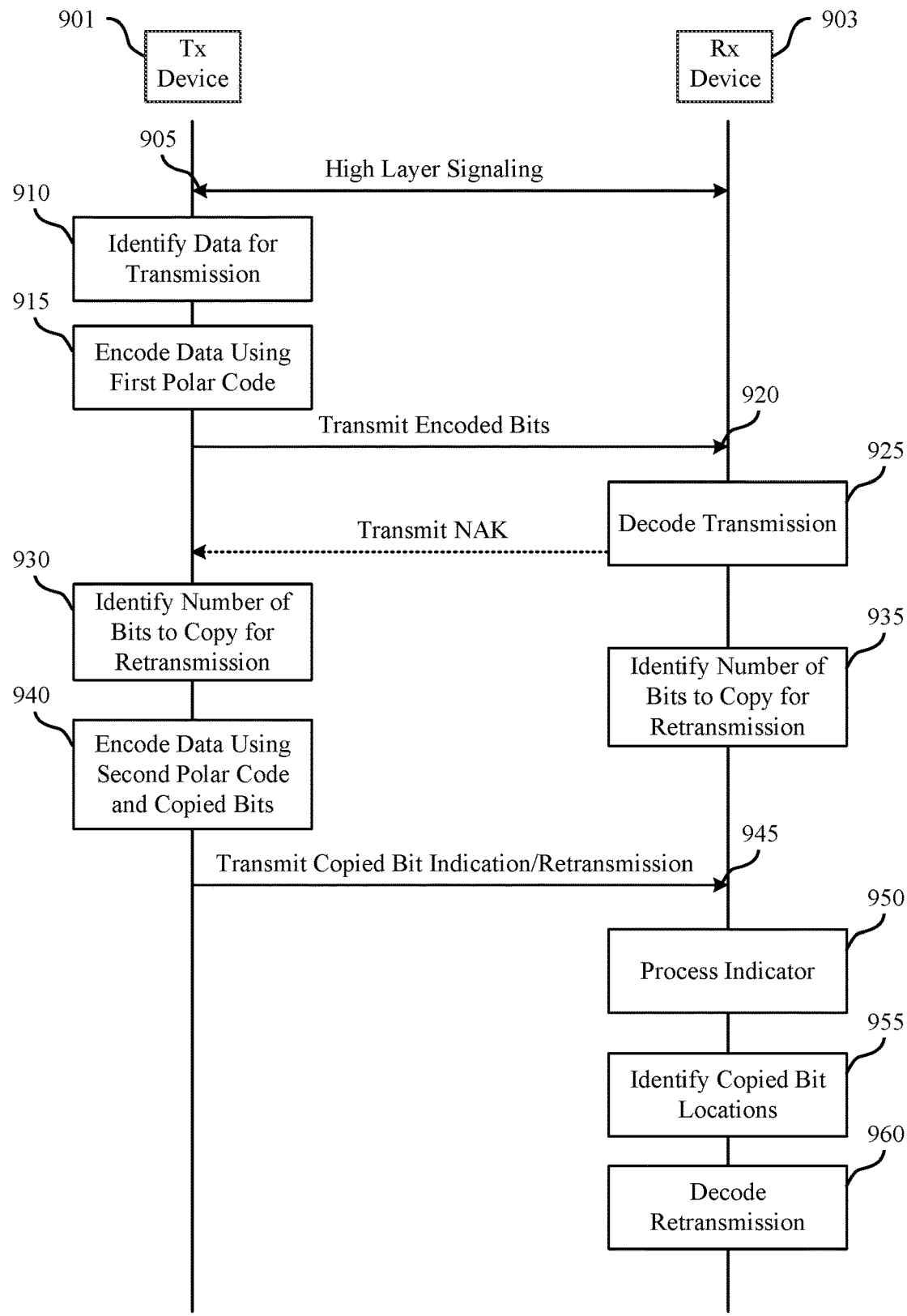
FIGS. 9 and 10 illustrate an example of a process flow for indicating a number of copied information bits in a retransmission in accordance with various aspects of the present disclosure.

FIG. 9 illustrates an example of a process flow 900 for indicating a number of copied information bits in a retransmission in accordance with various aspects of the present disclosure. Process flow 900 may be performed by transmitting device 901 and receiving device 903. Transmitting device 901 may be either a UE 115 or base station 105 as described above with reference to FIGS. 1-2. And receiving device 903 may be either a UE 115 or base station 105 as described above with reference to FIGS. 1-2

In some examples, transmitting device 901 and receiving device 903 may use retransmissions to communicate data when HARQ operation is available. Transmitting device 901 may copy one or more information bits to polarized bit channels of a polar code used for generating a retransmission. In some cases, transmitting device 901 selects a number of information bits to copy based on a change in channel conditions or transmission parameters between transmitting a first transmission and a retransmission, or between transmitting a first retransmission and a second retransmission, and indicates the selected number of copied information bits to receiving device 903. In some examples, receiving device 903 selects a number of information bits to copy based on a change in channel conditions or transmission parameters, and requests that transmitting device 901 copy the number of information bits in generating a retransmission.

At step 905, transmitting device 901 and receiving device 903 may exchange high-layer signaling via access stratum signaling (e.g., in RRC signaling) or in broadcast (e.g., in a master information block (MIB) or a system information block (SIB)). In some examples, transmitting device 901, which may be a base station, may transmit predetermined rules for copying data bits for retransmissions to receiving device 903, which may be a UE. In some examples, receiving device 903 may indicate to transmitting device 901 a HARQ capability, and transmitting device 901 may indicate to receiving device 903 that HARQ operation is active.

At step 910, transmitting device 901 may identify data intended for receiving device 903 is available for transmission. In some cases, the data for receiving device 903 may be generated within the transmitting device (e.g., by a user application or control service), and in some cases, the data may be generated external to the transmitting device (e.g., SMS data, a VoIP from another user, and the like). In some examples, the data may be represented as one or more information bits.

At step 915, transmitting device 901 may encode the data using a first polar code of a first size N to generate a first codeword. Encoding the data may include mapping the information bits to polarized data channels of the first polar code, and XOR'ing the polarized data channels with one another, yielding encoded bits. In some cases, each polarized data channel may be associated with a bit channel reliability corresponding to a likelihood that an information bit mapped to the polarized data channel will be successfully decoded at a receiving device. In some examples, the bit channel reliabilities are based on channel conditions or transmission parameters. In some examples, the number of encoded bits output by the polar code may be greater than the number of information bits input to the polar code. The polar encoded bits may be used to convey the information bits, and may also convey information for decoding other encoded bits which may increase the likelihood that receiving device 903 will successfully decode the encoded bits.

At step 920, transmitting device 901 may transmit the encoded bits to receiving device 903, which may receive the encoded bits. In some examples, transmitting device 901 may transmit the encoded bits using a first MCS and a first transmit power. In some examples, the first transmission may be associated with first channel conditions between transmitting device 901 and receiving device 903, which may be represented by first SNR levels.

At step 925, receiving device 903 may decode the received encoded bits. Decoding the encoded bits may include determining a decoding candidate for a received codeword by processing log-likelihood ratios (LLRs) for each of the encoded bits based on the positions of the encoded bits in the codeword. In some examples, processing the LLRs for one encoded bit may be based on the LLR received for another encoded bit. If receiving device 903 fails to decode the encoded bits, receiving device 903 may transmit a NAK to transmitting device 901. If receiving device 903 successfully decodes the encoded bits, receiving device 903 may transmits an ACK, in which case, transmitting device 901 may refrain from performing the subsequent steps and may prepare a new data transmission to receiving device 903 or another receiving device.

At step 930, transmitting device 901 may identify a first number of information bits to copy to polarized bit channels of a second polar code for generating a retransmission based on receiving a NAK from receiving device 903. In some examples, transmitting device 901 may identify the number of information bits to copy based on second channel conditions or second transmission parameters associated with the retransmission, which may be different than the first channel conditions or first transmission parameters associated with the first transmission.

At step 935, receiving device 903 may similarly identify a second number of information bits that are expected to be copied to the polarized bit channels of the second polar code for generating the retransmission. In some cases, the second number is different than the first number. In some examples, receiving device 903 may identify the second number of expected copied information bits based on a change in channel conditions from receiving the first transmission.

At step 940, transmitting device 901 may encode the information bits using the second polar code and one or more copied information bits based on the selected number of copied information bits. In some cases, the second polar code is of an effective size 2N and includes a lower polar code of size N and an upper polar code of size N. In some cases, the lower polar code may be the first polar code of size, and the copied information bits may be restricted to the polarized bit channels of the upper polar code—i.e., since the first polar code was previously used for generating the first encoded bits and is no longer available for use. In some cases, transmitting device 901 copies the information bits to the upper polar code based on a predetermined set of rules. In some cases, transmitting device 901 copies the information bits to the upper polar code based on calculating bit channel reliabilities of each polarized bit channel of the upper polar code, comparing the bit channel reliabilities of the upper polar code with each of the polarized bit channels of the first polar code carrying information bits, and copying the information bits mapped to lower polarized bit channel with lower reliabilities to the upper polarized bit channels with higher reliabilities. In some cases, the reliabilities of the upper polarized bit channels are based on the channel conditions or transmission parameters for the retransmission. In some cases, the encoding yields second encoded bits, which along with the first encoded bits, may make up a second codeword.

At step 945, transmitting device 901 may transmit the retransmission to receiving device 903 along with an indication of the number of copied information bits (which may range from 0 to N) used for generating the retransmission. In some examples, transmitting device 901 may also indicate which polarized bit channels of the second polar code are used by which copied information bits (i.e., a bit channel location of the copied information bits), channel conditions or change in channel conditions (e.g., an SNR level or SNR delta), and/or transmission parameters or a change in transmission parameter. For instance, transmitting device 901 may send an indication according to indicator 800 as discussed with reference to FIG. 8.

At step 950, receiving device 903 may process the received indication, and may determine the indicated number of copied information bits included in the retransmission. In some cases, receiving device 903 may also identify bit channel locations of the copied information bits, changes in channel conditions, and/or changes in transmission parameters. In some cases, receiving device 903 may identify that the indicated number of copied information bits is different than an expected number of copied information bits.

At step 955, receiving device 903 may identify that an unexpected information bit was copied to an unexpected polarized bit channel based on the received indicator, and may identify which polarized bit channels of the second polar code were assigned which copied information bits. In some cases, receiving device 903 may identify the copied information bit locations based on predetermined rules for copying information bits to the upper portion of the second polar code. In some cases, receiving device 903 may identify the copied information bit locations based on using an iterative process during which receiving device 903 incrementally updates a transmission parameter or channel condition measurement until receiving device 903 determines that the expected number of copied information bits equals the indicated number of copied information bits. In some cases, receiving device 903 may identify the copied information bit locations based on receiving an explicit indication of the copied information bit channel location(s). In some cases, receiving device 903 may identify the copied information bit location(s) based on calculating the bit channel locations using a received indication of the change channel conditions or transmission parameters.

At step 960, receiving device may decode the second codeword using the first encoded bits and the second encoded bits based on the identified bit channel location of the copied information bits.

Figure 10:
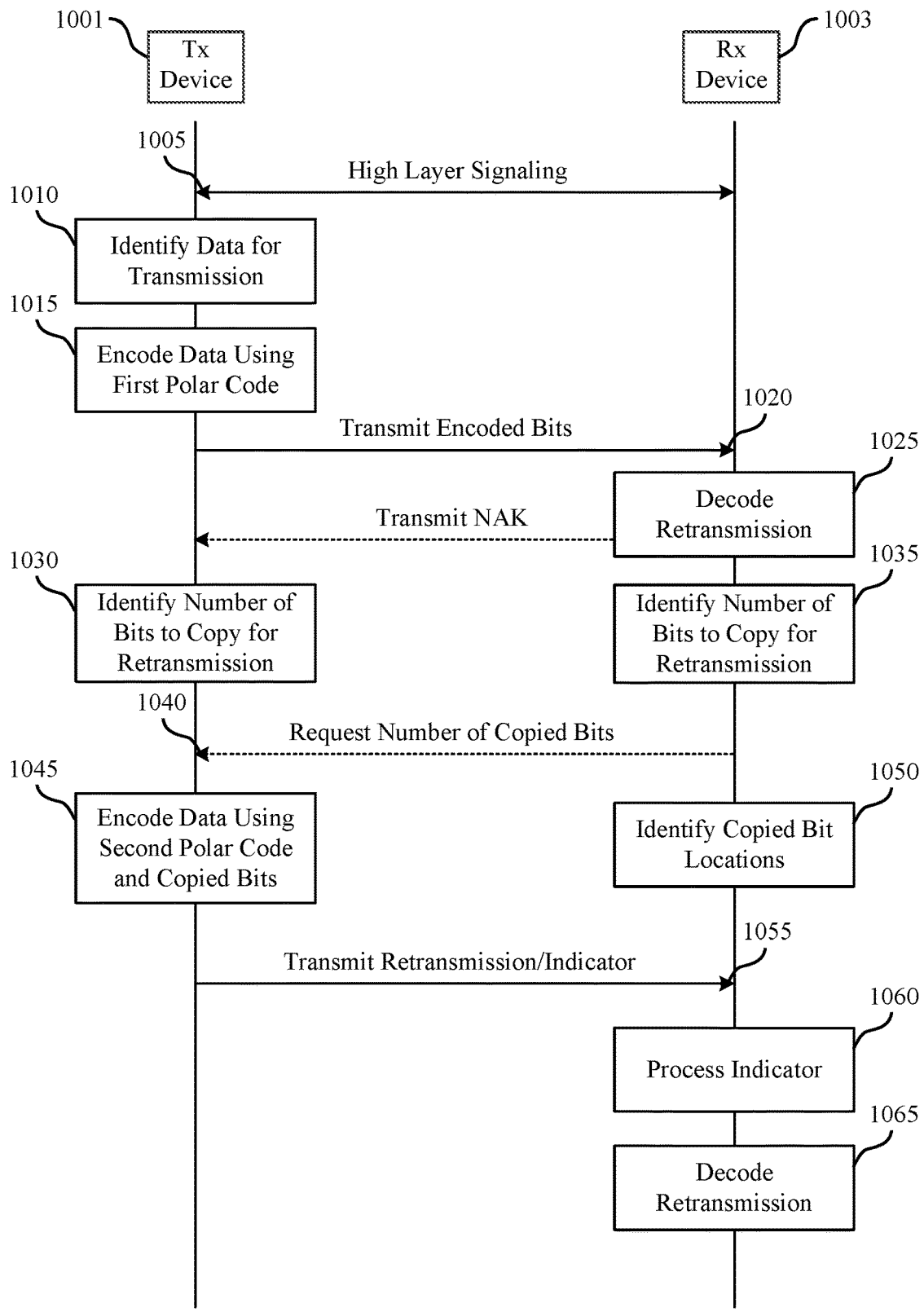

FIG. 10 illustrates an example of a process flow 1000 for indicating a number of copied information bits in a retransmission in accordance with various aspects of the present disclosure. Process flow 1000 may be performed by transmitting device 1001 and receiving device 1003. Transmitting device 1001 may be either a UE 115 or base station 105 as described above with reference to FIGS. 1-2. And receiving device 1003 may be either a UE 115 or base station 105 as described above with reference to FIGS. 1-2

Transmitting device 1001 and receiving device 1003 may perform steps 1005 to 1035 similar to the discussion of the performance of step 905 to 935 by transmitting device 901 and receiving device 903. The above discussion of FIG. 9 may also be generally incorporated into the following steps.

At step 1035, receiving device 1003 may identify an expected number of copied information bits in a retransmission. In some cases, receiving device 1003 may identify a different number of copied information bits than transmitting device 1001 based on observing a change in channel conditions between the two devices that is unknown to transmitting device 1001.

At step 1040, receiving device 1003 may request (e.g., in a downlink control channel) that transmitting device 1001 copy the expected number of copied information bits for a retransmission. In some cases, the request includes an indication of bit channel locations for copying the information bits, measured channel conditions, or a measured change in channel conditions.

At step 1045, transmitting device 1001 may encode the information bits for the retransmission using a second polar code of an effective second size based on the request. In some cases, transmitting device 1001 may copy the requested number of copied information bits to the upper polarized bit channels of the second polar code. Transmitting device 1001 may select bit channel locations for the copied information bits based on predetermined rules, an iterative process, indicated bit channel locations, and/or indicated channel conditions. In some cases, the encoding yields second encoded bits, which along with the first encoded bits, may make up a second codeword.

At step 1050, receiving device 1003 may also identify bit channel locations for the copied information bits. In some cases, receiving device 1003 identifies the same bit channel locations as transmitting device 1001 by using the same predetermined rules for copying information bits to the upper polarized channels of the second polar code (e.g., if one copied information bits copy to this polarized bit channels, if two copied information bits copy to these two polarized bit channels, and so on). In some cases, receiving device 1003 identifies bit channel locations for copied bits based on calculating bit channel reliabilities for the upper polarized bit channels based on measured channel conditions and comparing the bit channel reliabilities with the bit channel reliabilities of the lower, previously used, polarized bit channels.

At step 1055, transmitting device 1001 may transmit the retransmission and an indicator, which may indicate the number of copied bits in the retransmission, along with other information as discussed in step 855 of FIG. 8.

At step 1060, receiving device 1003 processes the received indicator. In some cases, the requested number of information bits and the indicated number of information bits are the same, in which case, receiving device 1003 may decode the second codeword based on the previously identified copied bit locations. In some cases, the requested number of information bits and the indicated number of information bits are different, in which case, receiving device 1003 may identify copied bit locations as discussed in step 855 of FIG. 8 and may decode the second codeword based on the identified copied bit locations.

Figure 11:
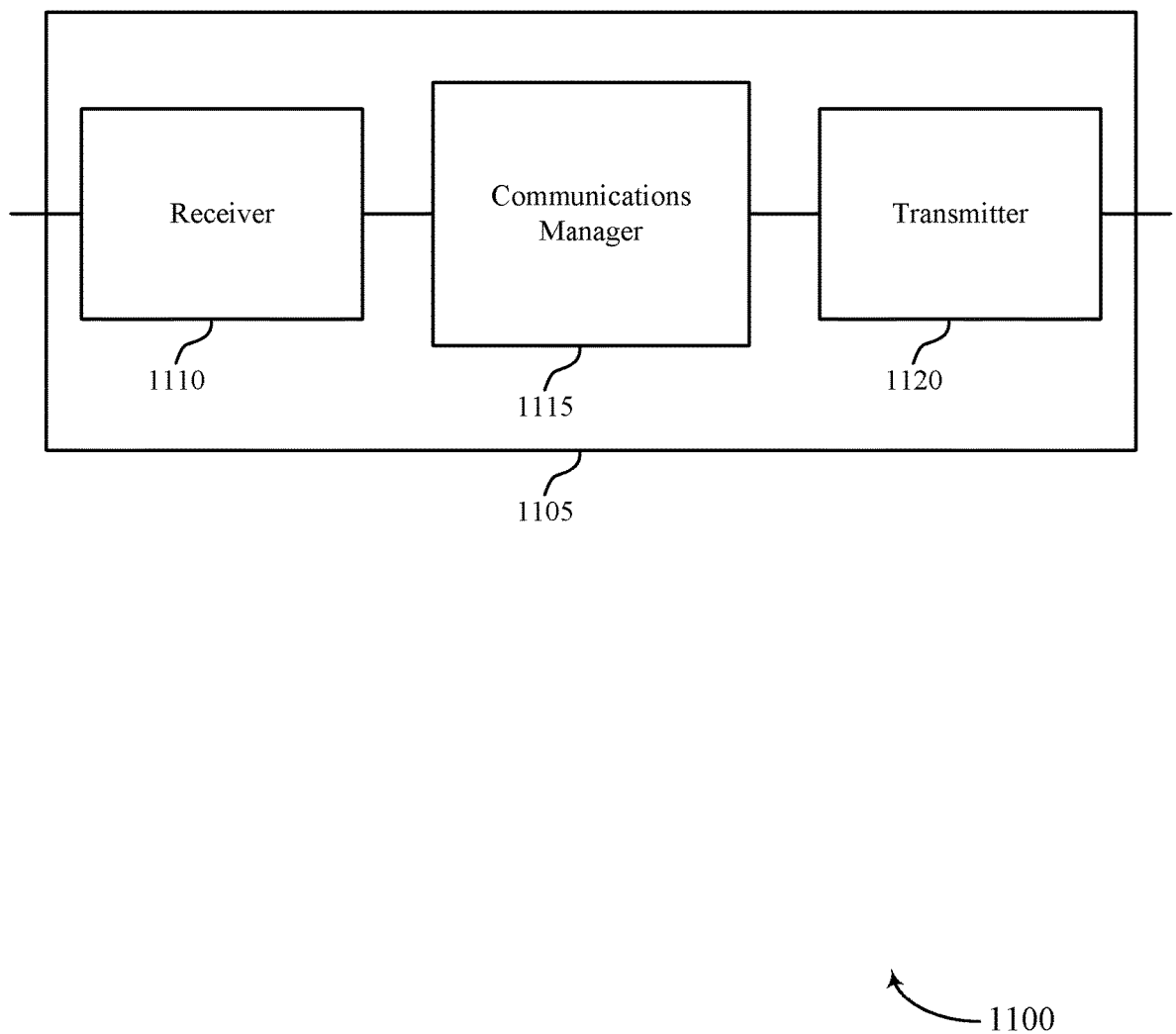
FIGS. 11 and 12 show block diagrams of a device that supports indicating a number of copied information bits in a retransmission in accordance with aspects of the present disclosure.

FIG. 11 shows a block diagram 1100 of a wireless device 1105 that supports indicating a number of copied information bits in a retransmission in accordance with aspects of the present disclosure. Wireless device 1105 may be an example of aspects of a user equipment (UE) 115 or base station 105 as described herein. Wireless device 1105 may include receiver 1110, communications manager 1115, and transmitter 1120. Wireless device 1105 may also include a processor. Each of these components may be in communication with one another (e.g., via one or more buses).

Receiver 1110 may receive information such as packets, user data, or control information associated with various information channels (e.g., control channels, data channels, and information related to indicating a number of copied information bits in a retransmission, etc.). Information may be passed on to other components of the device. The receiver 1110 may be an example of aspects of the transceiver 1335 described with reference to FIG. 13. The receiver 1110 may utilize a single antenna or a set of antennas.

Receiver 1110 may receive a first set of encoded bits from a device, the first set of encoded bits including a first codeword of a first size generated by mapping a set of information bits to a first set of polarized bit channels based on respective bit channel reliabilities of the first set of polarized bit channels Communications manager 1115 may be an example of aspects of the UE communications manager 1315 described with reference to FIG. 13.

Communications manager 1115 and/or at least some of its various sub-components may be implemented in hardware, software executed by a processor, firmware, or any combination thereof. If implemented in software executed by a processor, the functions of the communications manager 1115 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The communications manager 1115 and/or at least some of its various sub-components may be physically located at various positions, including being distributed such that portions of functions are implemented at different physical locations by one or more physical devices. In some examples, communications manager 1115 and/or at least some of its various sub-components may be a separate and distinct component in accordance with various aspects of the present disclosure. In other examples, communications manager 1115 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Communications manager 1115 may receive, from the receiving device, an indication that a decoding of the first codeword was unsuccessful and communicate, with the device, an indication of a first number of copied information bits used for generating a second set of encoded bits, where a second codeword of a second size includes the first set of encoded bits and the second set of encoded bits.

The communications manager 1115 may also transmit, to the transmitting device, an indication that decoding of the first codeword was unsuccessful, communicate, with the device, an indication of a first number of copied information bits used for generating a second set of encoded bits, where a second codeword of a second size includes the second set of encoded bits and the first set of encoded bits, and perform a first decoding operation on the second codeword.

Transmitter 1120 may transmit signals generated by other components of the device. In some examples, the transmitter 1120 may be collocated with a receiver 1110 in a transceiver module. For example, the transmitter 1120 may be an example of aspects of the transceiver 1335 described with reference to FIG. 13. The transmitter 1120 may utilize a single antenna or a set of antennas.

Transmitter 1120 may transmit a first set of encoded bits to a device, the first set of encoded bits including a first codeword of a first size generated by mapping a set of information bits to a first set of polarized bit channels based on respective first bit channel reliabilities of the first set of polarized bit channels and transmit the second set of encoded bits to the device.

Figure 12:
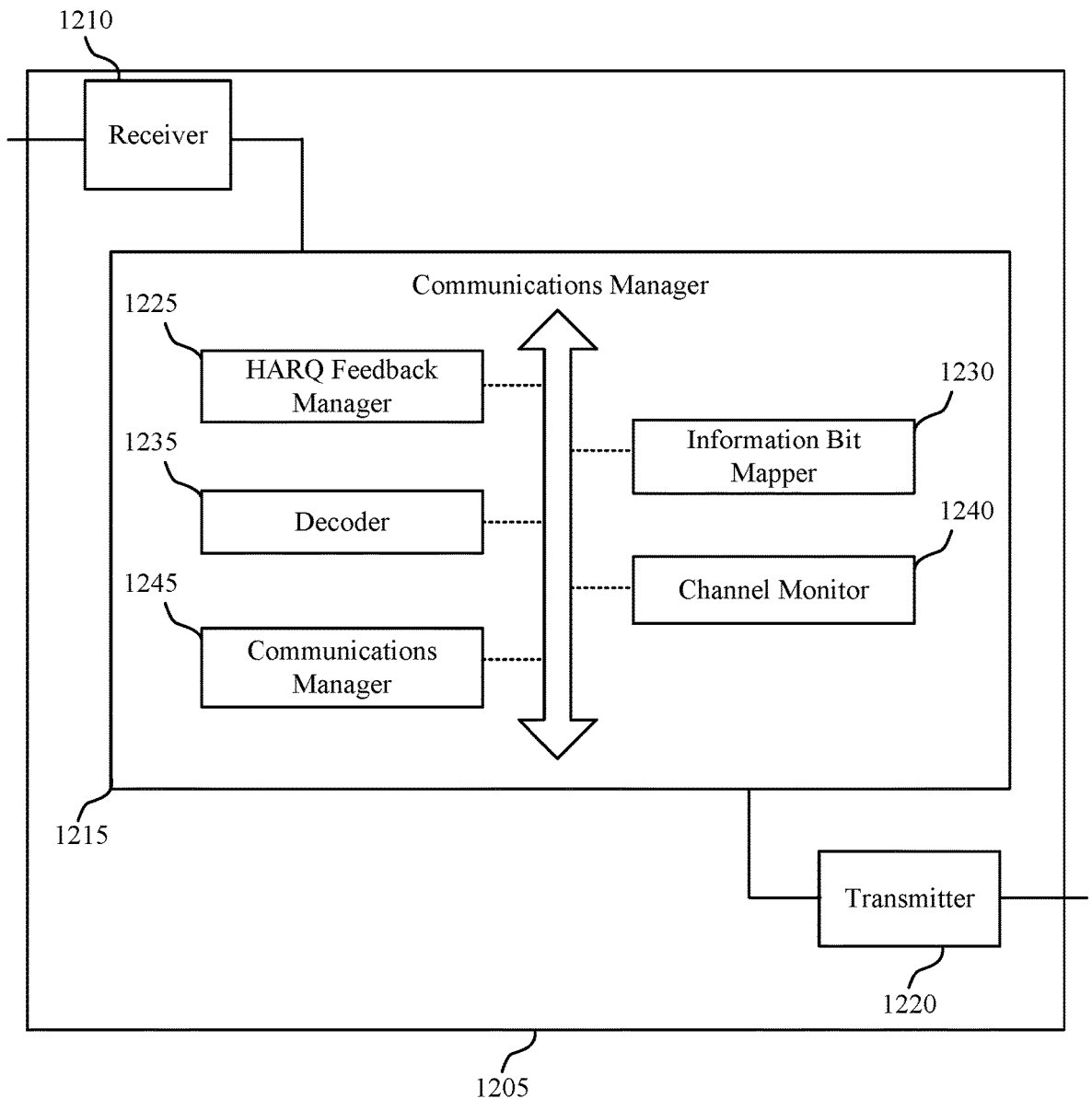

FIG. 12 shows a block diagram 1200 of a wireless device 1205 that supports indicating a number of copied information bits in a retransmission in accordance with aspects of the present disclosure. Wireless device 1205 may be an example of aspects of a wireless device 1105 or a UE 115 or base station 105 as described with reference to FIG. 11. Wireless device 1205 may include receiver 1210, communications manager 1215, and transmitter 1220. Wireless device 1205 may also include a processor. Each of these components may be in communication with one another (e.g., via one or more buses).

Receiver 1210 may receive information such as packets, user data, or control information associated with various information channels (e.g., control channels, data channels, and information related to indicating a number of copied information bits in a retransmission, etc.). Information may be passed on to other components of the device. The receiver 1210 may be an example of aspects of the transceiver 1335 described with reference to FIG. 13. The receiver 1210 may utilize a single antenna or a set of antennas.

Receiver 1210 may receive a first set of encoded bits from a device, the first set of encoded bits including a first codeword of a first size generated by mapping a set of information bits to a first set of polarized bit channels based on respective bit channel reliabilities of the first set of polarized bit channels. In some cases, receiver 1210 may also receive a second set of encoded bits from the device, and a third set of encoded bits from the device.

Decoder 1235 may perform a first decoding operation on the second codeword and perform a second decoding operation on the third codeword.

Communications manager 1215 may be an example of aspects of the UE communications manager 1315 described with reference to FIG. 13. Communications manager 1215 may also include HARQ feedback manager 1225, information bit mapper 1230, and decoder 1235.

HARQ feedback manager 1225 may receive, from the device, an indication that a decoding of the first codeword was unsuccessful. HARQ feedback manager 1225 may also receive, from the device, an indication that a decoding of a second codeword was unsuccessful. HARQ feedback manager 1225 may, in combination with transmitter 1220, also transmit, to the device, an indication that decoding of the first codeword was unsuccessful, and an indication that decoding of the second codeword was unsuccessful.

Information bit mapper 1230 may communicate, with a receiving device, an indication of a first number of copied information bits used for generating a second set of encoded bits, where a second codeword of a second size includes the first set of encoded bits and the second set of encoded bits. Information bit mapper 1230, in combination with transmitter 1220, may also communicate, with the device, an indication of a second number of copied information bits used for generating a third set of encoded bits, wherein a third codeword of a third size comprises the first set of encoded bits, the second set of encoded bits, and the third set of encoded bits. In some cases, information bit mapper 1230, in combination with transmitter 1220, may communicate an indication of one or more polarized bit channels of the second set of polarized bits channels used by at least one of the plurality of information bits.

In some examples, information bit mapper 1230, in combination with receiver 1210, may receive the indication of the first number of copied information bits in a downlink control channel when the second set of encoded bits are transmitted in an uplink data channel. Information bit mapper 1230, in combination with receiver 1210, may also receive the indication of the first number of copied information bits in a downlink control channel when the second set of encoded bits are transmitted in an uplink data channel.

In some cases, information bit mapper 1230 may determine the first number of copied information bits based on respective first bit channel reliabilities of the first set of polarized bit channels and respective second bit channel reliabilities of the first set of polarized bit channels and a second set of polarized bit channels corresponding to the second set of encoded bits. Information bit mapper 1230 may also determine the second number of copied information bits based at least in part on the respective second bit channel reliabilities of the first set of polarized bit channels and the second set of polarized bit channels and respective third bit channel reliabilities of the first plurality of polarized bit channels, the second plurality of polarized bit channels, and a third plurality of polarized bit channels corresponding to the third set of encoded bits.

In some cases, information bit mapper 1230 may select a set of polarized bit channels of the second set of polarized bit channels for use by the first number of copied information bits based on a predetermined rule or set of rules, which may be based on the determined bit channel reliabilities. In some cases, the information bit mapper 1230 may determine the respective second bit channel reliabilities of the first plurality of polarized bit channels and the second plurality of polarized bit channels and may select a set of polarized bit channels of the second set of polarized bit channels for use by the first number of copied information bits based at least in part on the respective first bit channel reliabilities of the first set of polarized bit channels and the determined respective second bit channel reliabilities of the first plurality of polarized bit channels and the second plurality of polarized bit channels based at least in part on the channel monitor 1240 identifying a change in channel conditions for transmitting the second set of encoded bits relative to the transmitting the first set of encoded bits.

In some cases, the information bit mapper 1230 may determine the respective second bit channel reliabilities of the first plurality of polarized bit channels and the second plurality of polarized bit channels based on the communications manager 1245 modifying a transmit parameter after transmitting the first set of encoded bits. Modifying the transmit parameter may include modifying a transmit power for the transmitting of the second set of encoded bits.

In some cases, information bit mapper 1230 may determine, based on a transmission parameter and a channel estimate associated with transmitting the second set of encoded bits, a second number of copied information bits based at least in part on second bit channel reliabilities of the first set of polarized bit channels and a second set of polarized bit channels corresponding to the second set of encoded bits, and may identify that the second number of copied information bits is different than the received first number of copied information bits. Information bit mapper 1230 may also identify one or more polarized bit channels corresponding to the first number of copied information bits based at least in part on a predetermined rule or set of rules, the one or more polarized bit channels being identified from a second set of polarized bit channels corresponding to the second set of encoded bits. Information bit mapper 1230 may also identify a set of polarized bit channels of the second set of polarized bit channels based at least in part on iteratively modifying at least one of the transmission parameter or the channel estimate associated with the receiving of the second set of encoded bits until a number of polarized bit channels of the second set of polarized bit channels having the second respective bit channel reliabilities greater than the first respective bit channel reliabilities is equal to the first number of copied information bits In some examples, information bit mapper 1230 may identify a set of polarized bit channels of a second set of polarized bit channels corresponding to the first number of copied information bits based at least in part on second bit channel reliabilities of the first set of polarized bit channels and the second set of polarized bit channels corresponding to the second set of encoded bits. Identifying the set of polarized bit channels may include determining, based on a transmission parameter and a channel estimate associated with the receiving of the first set of encoded bits, a number of the plurality of information bits for generating the second set of encoded bits that is different than the first number.

In some cases, information bit mapper 1230 may identify the set of polarized bit channels of the second set of polarized bit channels corresponding to the first number of copied information bits based at least in part on a predetermined rule or set of rules, which may be associated with determined bit channel reliabilities. In some cases, information bit mapper 1230 may identify the set of polarized bit channels of the second set of polarized bit channels based at least in part on iteratively modifying at least one of the transmission parameter or the channel estimate associated with the receiving of the second set of encoded bits until a number of polarized bit channels of the second set of polarized bit channels having the second respective bit channel reliabilities greater than the first respective bit channel reliabilities is equal to the first number of copied information bits. In some cases, information bit mapper 1230, in combination with receiver 1210, may receive an indication of a modified transmission parameter or a modified channel estimate for the receiving of the second set of encoded bits; and identify the set of polarized bit channels based at least in part on the indication of the modified transmission parameter or the modified channel estimate.

In some cases, information bit mapper 1230 may communicate an indication of one or more polarized bit channels of the second set of polarized bits channels used by at least one of the plurality of information bits. In some cases, information bit mapper 1230, in combination with receiver 1210, may receiving the indication of the first number of copied information bits in a downlink control channel when the second set of encoded bits are received in a downlink data channel. In some cases, information bit mapper 1230, in combination with transmitter 1220, may transmitting the indication of the first number of copied information bits in a downlink control channel, and wherein the second set of encoded bits are received in an uplink data channel. In some cases, information bit mapper 1230, in combination with receiver 1210, may receive the indication of the first number of copied information bits in a first portion of an uplink data channel when the second set of encoded bits are received in a second portion of the uplink data channel.

Transmitter 1220 may transmit signals generated by other components of the device. In some examples, the transmitter 1220 may be collocated with a receiver 1210 in a transceiver module. For example, the transmitter 1220 may be an example of aspects of the transceiver 1335 described with reference to FIG. 13. The transmitter 1220 may utilize a single antenna or a set of antennas.

Transmitter 1220 may transmit a first set of encoded bits to a device, the first set of encoded bits including a first codeword of a first size generated by mapping a set of information bits to a first set of polarized bit channels based on respective first bit channel reliabilities of the first set of polarized bit channels. Transmitter 1220 may also transmit the second set of encoded bits to the device. In transmitter 1220 may transmit the indication of the first number of copied information bits. In some cases, transmitter 1220 may transmit a third set of encoded bits to the device. Transmitter 1220 may also transmit an indication of the change in channel conditions, and/or an indication of the modified transmit parameter. In some cases, the indication of the first number of copied information bits is transmitted in a downlink control channel, and the second set of encoded bits are transmitted in a downlink data channel. In some cases, the indication of the first number of copied information bits is transmitted in a first portion of an uplink data channel, and the second set of encoded bits are transmitted in a second portion of the uplink data channel.

Figure 13:
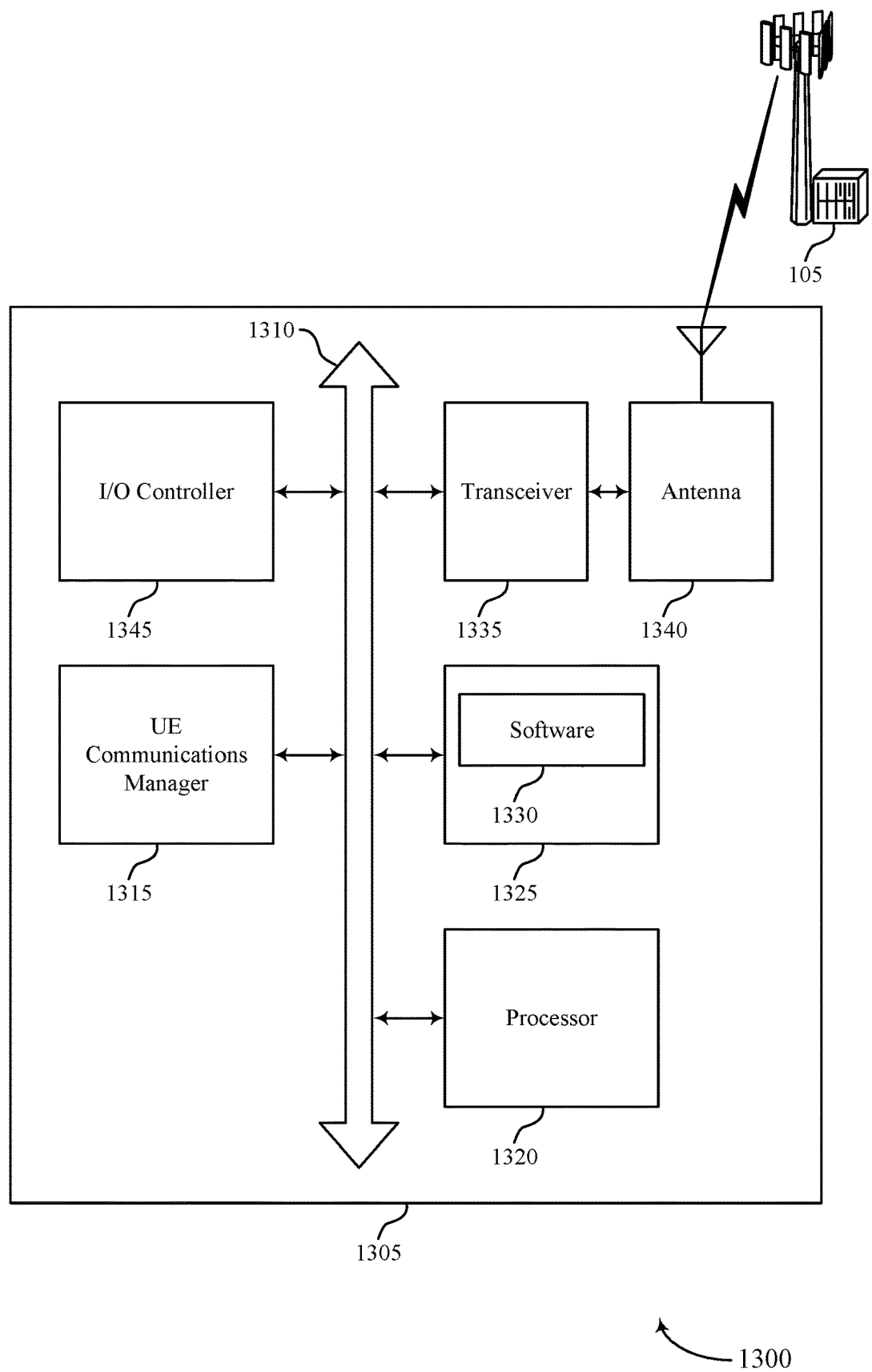
FIG. 13 illustrates a block diagram of a system including a UE that supports indicating a number of copied information bits in a retransmission in accordance with aspects of the present disclosure.

FIG. 13 shows a diagram of a system 1300 including a device 1305 that supports indicating a number of copied information bits in a retransmission in accordance with aspects of the present disclosure. Device 1305 may be an example of or include the components of wireless device 1105, wireless device 1205, or a UE 115 as described above, e.g., with reference to FIGS. 11 and 12. Device 1305 may include components for bi-directional voice and data communications including components for transmitting and receiving communications, including UE communications manager 1315, processor 1320, memory 1325, software 1330, transceiver 1335, antenna 1340, and I/O controller 1345. These components may be in electronic communication via one or more buses (e.g., bus 1310). Device 1305 may communicate wirelessly with one or more base stations 105.

Processor 1320 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1320 may be configured to operate a memory array using a memory controller. In other cases, a memory controller may be integrated into processor 1320. Processor 1320 may be configured to execute computer-readable instructions stored in a memory to perform various functions (e.g., functions or tasks supporting indicating a number of copied information bits in a retransmission).

Memory 1325 may include random access memory (RAM) and read only memory (ROM). The memory 1325 may store computer-readable, computer-executable software 1330 including instructions that, when executed, cause the processor to perform various functions described herein. In some cases, the memory 1325 may contain, among other things, a basic input/output system (BIOS) which may control basic hardware or software operation such as the interaction with peripheral components or devices.

Software 1330 may include code to implement aspects of the present disclosure, including code to support indicating a number of copied information bits in a retransmission. Software 1330 may be stored in a non-transitory computer-readable medium such as system memory or other memory. In some cases, the software 1330 may not be directly executable by the processor but may cause a computer (e.g., when compiled and executed) to perform functions described herein.

Transceiver 1335 may communicate bi-directionally, via one or more antennas, wired, or wireless links as described above. For example, the transceiver 1335 may represent a wireless transceiver and may communicate bi-directionally with another wireless transceiver. The transceiver 1335 may also include a modem to modulate the packets and provide the modulated packets to the antennas for transmission, and to demodulate packets received from the antennas.

In some cases, the wireless device may include a single antenna 1340. However, in some cases the device may have more than one antenna 1340, which may be capable of concurrently transmitting or receiving multiple wireless transmissions.

I/O controller 1345 may manage input and output signals for device 1305. I/O controller 1345 may also manage peripherals not integrated into device 1305. In some cases, I/O controller 1345 may represent a physical connection or port to an external peripheral. In some cases, I/O controller 1345 may utilize an operating system such as iOS®, ANDROID®, MS-DOS®, MS-WINDOWS®, OS/2®, UNIX®, LINUX®, or another known operating system. In other cases, I/O controller 1345 may represent or interact with a modem, a keyboard, a mouse, a touchscreen, or a similar device. In some cases, I/O controller 1345 may be implemented as part of a processor. In some cases, a user may interact with device 1305 via I/O controller 1345 or via hardware components controlled by I/O controller 1345.

Figure 14:
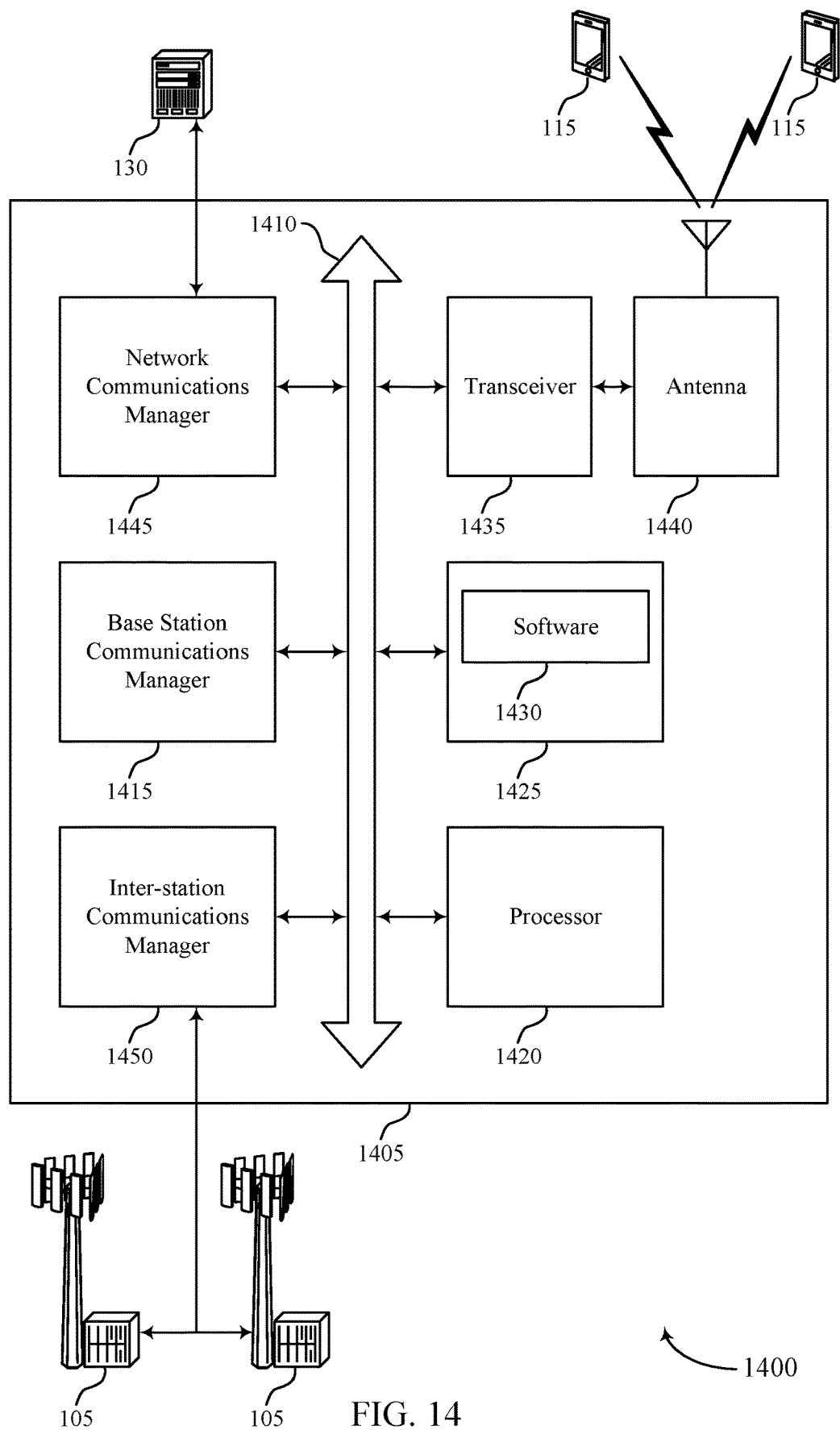
FIG. 14 illustrates a block diagram of a system including a base station that supports indicating a number of copied information bits in a retransmission in accordance with aspects of the present disclosure.

FIG. 14 shows a diagram of a system 1400 including a device 1405 that supports indicating a number of copied information bits in a retransmission in accordance with aspects of the present disclosure. Device 1405 may be an example of or include the components of wireless device 1205 or a base station 105 as described above, e.g., with reference to FIG. 12. Device 1405 may include components for bi-directional voice and data communications including components for transmitting and receiving communications, including base station communications manager 1415, processor 1420, memory 1425, software 1430, transceiver 1435, antenna 1440, network communications manager 1445, and inter-station communications manager 1450. These components may be in electronic communication via one or more buses (e.g., bus 1410). Device 1405 may communicate wirelessly with one or more UEs 115.

Processor 1420 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1420 may be configured to operate a memory array using a memory controller. In other cases, a memory controller may be integrated into processor 1420. Processor 1420 may be configured to execute computer-readable instructions stored in a memory to perform various functions (e.g., functions or tasks supporting indicating a number of copied information bits in a retransmission).

Memory 1425 may include RAM and ROM. The memory 1425 may store computer-readable, computer-executable software 1430 including instructions that, when executed, cause the processor to perform various functions described herein. In some cases, the memory 1425 may contain, among other things, a BIOS which may control basic hardware or software operation such as the interaction with peripheral components or devices.

Software 1430 may include code to implement aspects of the present disclosure, including code to support indicating a number of copied information bits in a retransmission. Software 1430 may be stored in a non-transitory computer-readable medium such as system memory or other memory. In some cases, the software 1430 may not be directly executable by the processor but may cause a computer (e.g., when compiled and executed) to perform functions described herein.

Transceiver 1435 may communicate bi-directionally, via one or more antennas, wired, or wireless links as described above. For example, the transceiver 1435 may represent a wireless transceiver and may communicate bi-directionally with another wireless transceiver. The transceiver 1435 may also include a modem to modulate the packets and provide the modulated packets to the antennas for transmission, and to demodulate packets received from the antennas.

In some cases, the wireless device may include a single antenna 1440. However, in some cases the device may have more than one antenna 1440, which may be capable of concurrently transmitting or receiving multiple wireless transmissions.

Network communications manager 1445 may manage communications with the core network (e.g., via one or more wired backhaul links). For example, the network communications manager 1445 may manage the transfer of data communications for client devices, such as one or more UEs 115.

Inter-station communications manager 1450 may manage communications with other base station 105, and may include a controller or scheduler for controlling communications with UEs 115 in cooperation with other base stations 105. For example, the inter-station communications manager 1450 may coordinate scheduling for transmissions to UEs 115 for various interference mitigation techniques such as beamforming or joint transmission. In some examples, inter-station communications manager 1450 may provide an X2 interface within an Long Term Evolution (LTE)/LTE-A wireless communication network technology to provide communication between base stations 105.

Figure 15:
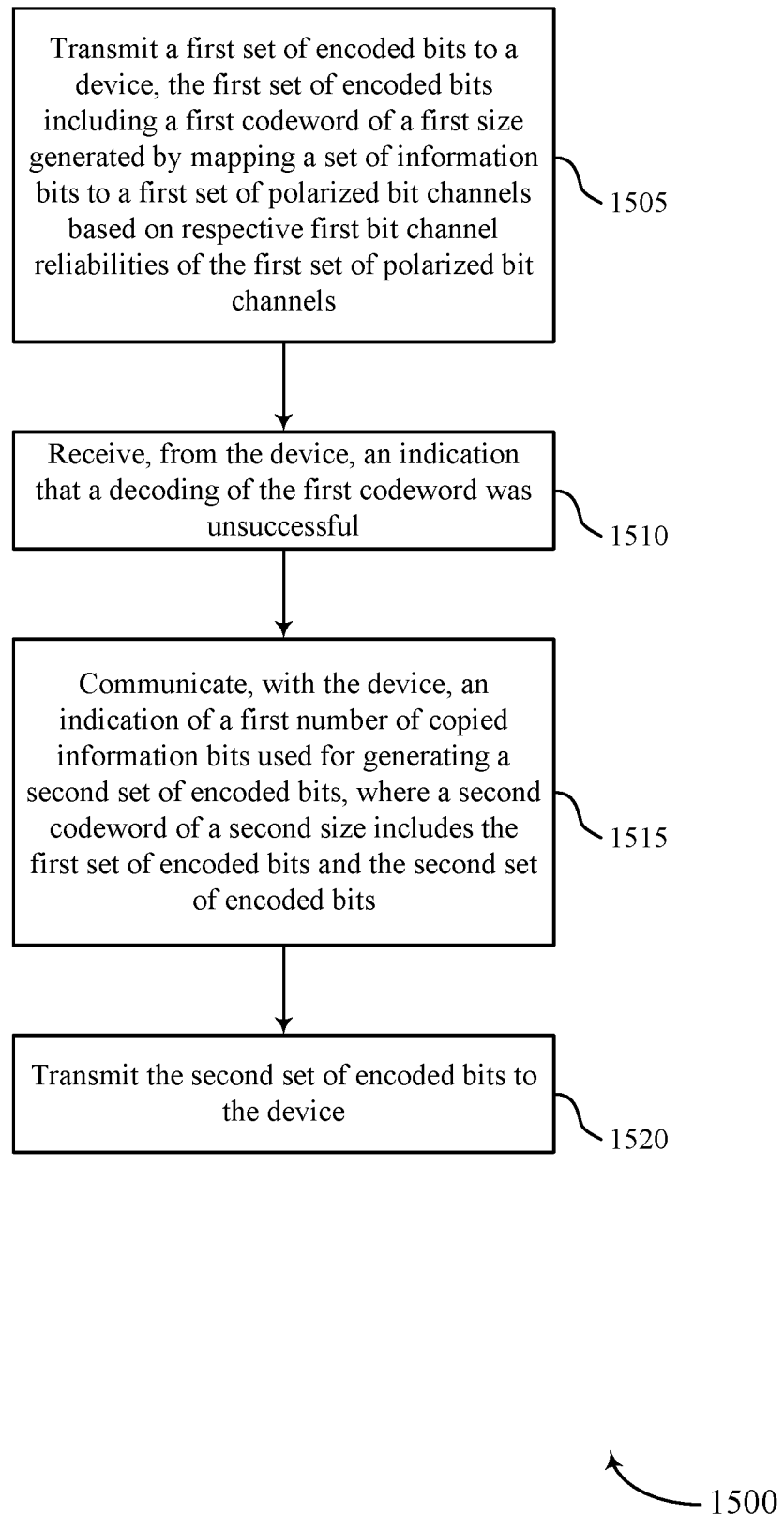
FIGS. 15 through 16 illustrate methods for indicating a number of copied information bits in a retransmission in accordance with aspects of the present disclosure.

FIG. 15 shows a flowchart illustrating a method 1500 for indicating a number of copied information bits in a retransmission in accordance with aspects of the present disclosure. The operations of method 1500 may be implemented by a UE 115 or base station 105 or its components as described herein. For example, the operations of method 1500 may be performed by a communications manager as described with reference to FIGS. 11 through 12. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1505 the UE 115 or base station 105 may transmit a first set of encoded bits to a device, the first set of encoded bits comprising a first codeword of a first size generated by mapping a plurality of information bits to a first set of polarized bit channels based on respective first bit channel reliabilities of the first set of polarized bit channels.

The operations of block 1505 may be performed according to the methods described herein. In certain examples, aspects of the operations of block 1505 may be performed by a transmitter as described with reference to FIGS. 11 through 12.

At block 1510 the UE 115 or base station 105 may receive, from the device, an indication that a decoding of the first codeword was unsuccessful. The operations of block 1510 may be performed according to the methods described herein. In certain examples, aspects of the operations of block 1510 may be performed by a HARQ feedback manager as described with reference to FIGS. 11 through 12.

At block 1515 the UE 115 or base station 105 may communicate, with the device, an indication of a first number of copied information bits used for generating a second set of encoded bits, wherein a second codeword of a second size comprises the first set of encoded bits and the second set of encoded bits. The operations of block 1515 may be performed according to the methods described herein. In certain examples, aspects of the operations of block 1515 may be performed by an information bit mapper as described with reference to FIGS. 11 through 12.

At block 1520 the UE 115 or base station 105 may transmit the second set of encoded bits to the device. The operations of block 1520 may be performed according to the methods described herein. In certain examples, aspects of the operations of block 1520 may be performed by a transmitter as described with reference to FIGS. 11 through 12.

Figure 16:
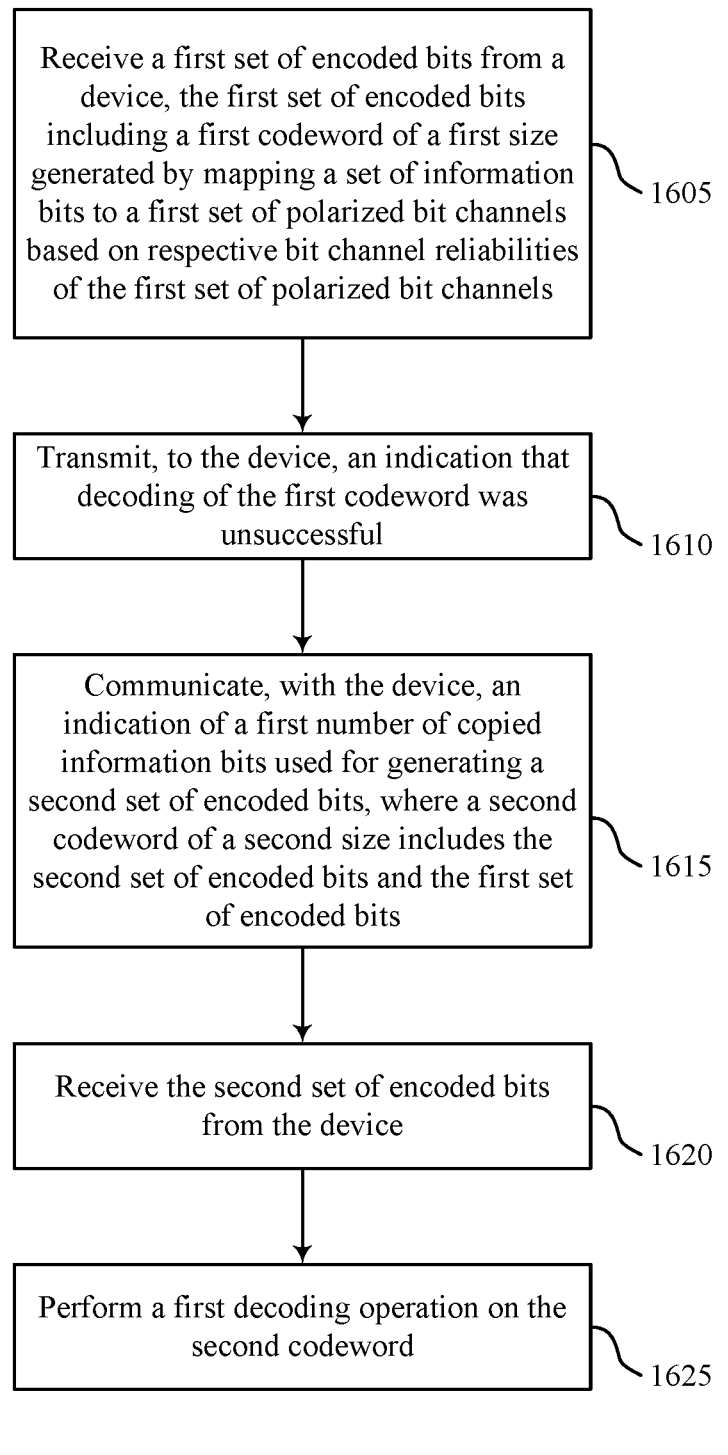

FIG. 16 shows a flowchart illustrating a method 1600 for indicating a number of copied information bits in a retransmission in accordance with aspects of the present disclosure. The operations of method 1600 may be implemented by a UE 115 or base station 105 or its components as described herein. For example, the operations of method 1600 may be performed by a communications manager as described with reference to FIGS. 11 through 12. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1605 the UE 115 or base station 105 may receive a first set of encoded bits from a device, the first set of encoded bits comprising a first codeword of a first size generated by mapping a plurality of information bits to a first set of polarized bit channels based on respective bit channel reliabilities of the first set of polarized bit channels. The operations of block 1605 may be performed according to the methods described herein. In certain examples, aspects of the operations of block 1605 may be performed by a receiver as described with reference to FIGS. 11 through 12.

At block 1610 the UE 115 or base station 105 may transmit, to the device, an indication that decoding of the first codeword was unsuccessful. The operations of block 1610 may be performed according to the methods described herein. In certain examples, aspects of the operations of block 1610 may be performed by a HARQ feedback manager as described with reference to FIGS. 11 through 12.

At block 1615 the UE 115 or base station 105 may communicate, with the device, an indication of a first number of copied information bits used for generating a second set of encoded bits, wherein a second codeword of a second size comprises the second set of encoded bits and the first set of encoded bits. The operations of block 1615 may be performed according to the methods described herein. In certain examples, aspects of the operations of block 1615 may be performed by an information bit mapper as described with reference to FIGS. 11 through 12.

At block 1620 the UE 115 or base station 105 may receive the second set of encoded bits from the device. The operations of block 1620 may be performed according to the methods described herein. In certain examples, aspects of the operations of block 1620 may be performed by a receiver as described with reference to FIGS. 11 through 12.

At block 1625 the UE 115 or base station 105 may perform a first decoding operation on the second codeword. The operations of block 1625 may be performed according to the methods described herein. In certain examples, aspects of the operations of block 1625 may be performed by a decoder as described with reference to FIGS. 11 through 12.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and wireless communications subsystem 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
   transmitting a first set of encoded bits to a device, the first set of encoded bits comprising a first codeword of a first size generated by mapping a plurality of information bits to a first set of polarized bit channels based on respective first bit channel reliabilities of the first set of polarized bit channels;
   receiving, from the device, an indication that a decoding of the first codeword was unsuccessful;
   identifying a change in channel conditions for transmitting a second set of encoded bits relative to transmitting the first set of encoded bits;
   determining a first number of the plurality of information bits to copy for generating the second set of encoded bits based at least in part on the change in channel conditions;
   communicating, with the device, an indication that the first number of the plurality of information bits were copied, the first number of copied information bits used for generating the second set of encoded bits, wherein a second codeword of a second size comprises the first set of encoded bits and the second set of encoded bits; and
   transmitting the second set of encoded bits to the device.

2. The method of claim 1, further comprising:
   selecting a set of polarized bit channels of a second set of polarized bit channels corresponding to the second set of encoded bits for use by the first number of copied information bits based at least in part on a predetermined rule or set of rules.

3. The method of claim 1, wherein the communicating comprises transmitting the indication of the first number of copied information bits.

4. The method of claim 3, further comprising:
   determining the first number of copied information bits based at least in part on second bit channel reliabilities of the first set of polarized bit channels and a second set of polarized bit channels corresponding to the second set of encoded bits.

5. The method of claim 1, further comprising:
   determining respective second bit channel reliabilities of the first set of polarized bit channels and a second set of polarized bit channels corresponding to the second set of encoded bits based at least in part on the change in channel conditions; and
   selecting a set of polarized bit channels of the second set of polarized bit channels for use by the first number of copied information bits based at least in part on the determined respective second bit channel reliabilities of the first set of polarized bit channels and the second set of polarized bit channels.

6. The method of claim 5, further comprising:
   transmitting an indication of the change in channel conditions.

7. The method of claim 4, further comprising:
   modifying a transmit parameter after transmitting the first set of encoded bits, wherein modifying the transmit parameter comprises modifying a transmit power for the transmitting of the second set of encoded bits; and
   determining the respective second bit channel reliabilities of the first set of polarized bit channels and the second set of polarized bit channels based at least in part on the modified transmit parameter.

8. The method of claim 7, further comprising:
   transmitting an indication of the modified transmit parameter.

9. The method of claim 4, further comprising:
   receiving, from the device, an indication that a decoding of the second codeword was unsuccessful;
   communicating, with the device, an indication of a second number of copied information bits used for generating a third set of encoded bits, wherein a third codeword of a third size comprises the first set of encoded bits, the second set of encoded bits, and the third set of encoded bits; and
   transmitting the third set of encoded bits to the device.

10. The method of claim 9, further comprising:
    determining the second number of copied information bits based at least in part on the respective second bit channel reliabilities of the first set of polarized bit channels and the second set of polarized bit channels and respective third bit channel reliabilities of the first set of polarized bit channels, the second set of polarized bit channels, and a third set of polarized bit channels corresponding to the third set of encoded bits.

11. The method of claim 4, wherein the communicating comprises communicating an indication of one or more polarized bit channels of the second set of polarized bit channels used by at least one of the plurality of information bits.

12. The method of claim 3, wherein the indication of the first number of copied information bits is transmitted in a downlink control channel, and wherein the second set of encoded bits are transmitted in a downlink data channel.

13. The method of claim 3, wherein the indication of the first number of copied information bits is transmitted in a first portion of an uplink data channel, and wherein the second set of encoded bits are transmitted in a second portion of the uplink data channel.

14. The method of claim 1, wherein the communicating comprises receiving the indication of the first number of copied information bits in a downlink control channel, and wherein the second set of encoded bits are transmitted in an uplink data channel.

15. The method of claim 14, further comprising:
determining, based on a transmission parameter and a channel estimate associated with transmitting the second set of encoded bits, a second number of copied information bits based at least in part on second bit channel reliabilities of the first set of polarized bit channels and a second set of polarized bit channels corresponding to the second set of encoded bits; and
identifying that the second number of copied information bits is different than the received first number of copied information bits.

16. The method of claim 15, further comprising:
identifying a set of polarized bit channels of the second set of polarized bit channels corresponding to the first number of copied information bits based at least in part on a predetermined rule or set of rules.

17. The method of claim 15, further comprising:
identifying a set of polarized bit channels of the second set of polarized bit channels based at least in part on iteratively modifying at least one of the transmission parameter or the channel estimate associated with the receiving of the second set of encoded bits until a number of polarized bit channels of the second set of polarized bit channels having the second respective bit channel reliabilities greater than the first respective bit channel reliabilities is equal to the first number of copied information bits.

18. A method for wireless communication, comprising:
receiving a first set of encoded bits from a device, the first set of encoded bits comprising a first codeword of a first size generated by mapping a plurality of information bits to a first set of polarized bit channels based on respective bit channel reliabilities of the first set of polarized bit channels;
transmitting, to the device, an indication that decoding of the first codeword was unsuccessful;
identifying a change in channel conditions for transmitting a second set of encoded bits relative to transmitting the first set of encoded bits;
determining a first number of the plurality of information bits to copy for generating the second set of encoded bits based at least in part on the change in channel conditions;
communicating, with the device, an indication to copy the first number of the plurality of information bits, the first number of copied information bits used for generating the second set of encoded bits, wherein a second codeword of a second size comprises the second set of encoded bits and the first set of encoded bits;
receiving the second set of encoded bits from the device; and
performing a first decoding operation on the second codeword.

19. The method of claim 18, further comprising:
identifying one or more polarized bit channels corresponding to the first number of copied information bits based at least in part on a predetermined rule or set of rules, the one or more polarized bit channels being identified from a second set of polarized bit channels corresponding to the second set of encoded bits.

20. The method of claim 18, further comprising:
identifying a set of polarized bit channels of a second set of polarized bit channels corresponding to the first number of copied information bits based at least in part on second bit channel reliabilities of the first set of polarized bit channels and the second set of polarized bit channels corresponding to the second set of encoded bits.

21. The method of claim 20, wherein the identifying the set of polarized bit channels comprises determining, based on a transmission parameter and a channel estimate associated with the receiving of the first set of encoded bits, a second number of copied information bits for generating the second set of encoded bits that is different than the first number of copied information bits.

22. The method of claim 21, further comprising:
identifying the set of polarized bit channels of the second set of polarized bit channels based at least in part on iteratively modifying at least one of the transmission parameter or the channel estimate associated with the receiving of the second set of encoded bits until a number of polarized bit channels of the second set of polarized bit channels having the second respective bit channel reliabilities greater than the first respective bit channel reliabilities is equal to the first number of copied information bits.

23. The method of claim 20, wherein the identifying the set of polarized bit channels comprises:
receiving an indication of a modified transmission parameter or a modified channel estimate for the receiving of the second set of encoded bits; and
identifying the set of polarized bit channels based at least in part on the indication of the modified transmission parameter or the modified channel estimate.

24. The method of claim 20, further comprising:
transmitting, to the device, an indication that decoding of the second codeword was unsuccessful;
communicating, with the device, an indication of a second number of copied information bits used for generating a third set of encoded bits, wherein a third codeword comprises the first set of encoded bits, the second set of encoded bits, and the third set of encoded bits;
receiving the third set of encoded bits from the device; and
performing a second decoding operation on the third codeword.

25. The method of claim 20, wherein the communicating comprises communicating an indication of one or more polarized bit channels of the second set of polarized bit channels used by at least one of the plurality of information bits.

26. The method of claim 18, wherein the communicating comprises receiving the indication of the first number of copied information bits in a downlink control channel, and wherein the second set of encoded bits are received in a downlink data channel.

27. The method of claim 18, wherein the communicating comprises transmitting the indication of the first number of copied information bits in a downlink control channel, and wherein the second set of encoded bits are received in an uplink data channel.

28. The method of claim 18, wherein the communicating comprises receiving the indication of the first number of copied information bits in a first portion of an uplink data channel, and wherein the second set of encoded bits are received in a second portion of the uplink data channel.

29. An apparatus for wireless communication, comprising:
- a processor;
- memory coupled with the processor; and
- instructions stored in the memory and operable, when executed by the processor, to cause the apparatus to:
    - transmit a first set of encoded bits to a device, the first set of encoded bits comprising a first codeword of a first size generated by mapping a plurality of information bits to a first set of polarized bit channels based on respective first bit channel reliabilities of the first set of polarized bit channels;
    - receive, from the device, an indication that a decoding of the first codeword was unsuccessful;
    - identify a change in channel conditions for transmitting a second set of encoded bits relative to transmitting the first set of encoded bits;
    - determine a first number of the plurality of information bits to copy for generating the second set of encoded bits based at least in part on the change in channel conditions;
    - communicate, with the device, an indication that the first number of the plurality of information bits were copied, the first number of copied information bits used for generating the second set of encoded bits, wherein a second codeword of a second size comprises the first set of encoded bits and the second set of encoded bits; and
    - transmit the second set of encoded bits to the device.

30. An apparatus for wireless communication, comprising:
- a processor;
- memory coupled with the processor; and
- instructions stored in the memory and operable, when executed by the processor, to cause the apparatus to:
    - receive a first set of encoded bits from a device, the first set of encoded bits comprising a first codeword of a first size generated by mapping a plurality of information bits to a first set of polarized bit channels based on respective bit channel reliabilities of the first set of polarized bit channels;
    - transmit, to the device, an indication that decoding of the first codeword was unsuccessful;
    - identify a change in channel conditions for transmitting a second set of encoded bits relative to transmitting the first set of encoded bits;
    - determine a first number of the plurality of information bits to copy for generating the second set of encoded bits based at least in part on the change in channel conditions;
    - communicate, with the device, an indication to copy the first number of the plurality of information bits, the first number of copied information bits used for generating the second set of encoded bits, wherein a second codeword of a second size comprises the second set of encoded bits and the first set of encoded bits;
    - receive the second set of encoded bits from the device; and
    - perform a first decoding operation on the second codeword.

* * * * *